United States Patent
Hasegawa et al.

(10) Patent No.: US 6,921,587 B2
(45) Date of Patent: Jul. 26, 2005

(54) MAGNETIC SENSING ELEMENT INCLUDING SECOND FREE MAGNETIC LAYER EXTENDING WIDER THAN TRACK WIDTH AND METHOD FOR FABRICATING SAME

(75) Inventors: Naoya Hasegawa, Niigata-ken (JP); Eiji Umetsu, Niigata-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 0 days.

(21) Appl. No.: 10/603,986

(22) Filed: Jun. 24, 2003

(65) Prior Publication Data
US 2004/0072020 A1 Apr. 15, 2004

(30) Foreign Application Priority Data
Jun. 25, 2002 (JP) ........................................ 2002-184043

(51) Int. Cl.[7] ............................................... G11B 5/127
(52) U.S. Cl. ...................... 428/686; 428/156; 428/692; 360/324.11; 360/324.12
(58) Field of Search ................................ 428/686, 156, 428/692; 360/324.11, 324.12

(56) References Cited

U.S. PATENT DOCUMENTS 6,249,406 B1 * 6/2001 Gill et al. .............. 360/324.11
6,451,215 B1 * 9/2002 Shimazawa et al. ......... 216/22
6,459,551 B1 * 10/2002 Hayakawa ................... 360/313
6,469,879 B1 * 10/2002 Redon et al. ............. 360/324.2
2002/0131215 A1 * 9/2002 Beach ...................... 360/324.2
2002/0167768 A1   11/2002 Fontana et al.
2003/0030948 A1 *  2/2003 Umetsu ................. 360/324.12
2003/0206384 A1 * 11/2003 Hoshiya et al. ........ 360/324.12
2005/0030676 A1 *  2/2005 Fukuzawa et al. .......... 360/325

FOREIGN PATENT DOCUMENTS

| JP | 10-124823 | | 5/1998 |
| JP | 2000-293822 | | 10/2000 |
| JP | 2001-006127 A | * | 1/2001 |
| JP | 2002-232037 | | 8/2002 |
| JP | 2003-060264 A | * | 2/2003 |

* cited by examiner

Primary Examiner—Kevin M. Bernatz
(74) Attorney, Agent, or Firm—Brinks Hofer Gilson & Lione

(57) ABSTRACT

Disclosed are a CPP magnetic sensing element employing the exchange bias method in which a sensing current is prevented from expanding in the track width direction in the multilayer film while the magnetization of the free magnetic layer is controlled properly, side reading is effectively prevented, and read output is improved, and a method for fabricating the same. First insulating layers are disposed at both sides in the track width direction of a multilayer film, a second free magnetic layer is disposed over the multilayer film and the first insulating layers, and second antiferromagnetic layers are disposed on both side regions of the second free magnetic layer.

15 Claims, 13 Drawing Sheets

MAGNETIC SENSING ELEMENT INCLUDING SECOND FREE MAGNETIC LAYER EXTENDING WIDER THAN TRACK WIDTH AND METHOD FOR FABRICATING SAME

BACKGROUND OF THE INVENTION

1. Field of the Invention

The present invention relates to a current-perpendicular-to-the-plane (CPP) magnetic sensing element in which a sensing current flows in the thickness direction of each layer of the multilayer film. More particularly, the invention relates to a magnetic sensing element in which the sensing current is prevented from expanding in the track width direction in the multilayer film, enabling an improvement in read output, and to a method for fabricating the same.

2. Description of the Related Art

FIG. 14 is a partial sectional view which shows a structure of a conventional magnetic sensing element, viewed from the surface facing a recording medium.

A lower electrode layer 13 is composed of a NiFe alloy or the like. A first antiferromagnetic layer 3, a pinned magnetic layer 4, a nonmagnetic material layer 5, and a free magnetic layer 6 are deposited in that order on the lower electrode layer 13. A laminate including the first antiferromagnetic layer 3 to the free magnetic layer 6 is referred to as a multilayer film 11.

Second antiferromagnetic layers 7 are disposed on side regions 6a of the free magnetic layer 6, and insulating layers 12 are disposed on the second antiferromagnetic layers 7.

An upper electrode, layer 14 is disposed over the insulating layers 12 and the central region 6b of the free magnetic layer 6 exposed to a space between the second antiferromagnetic layers 7 in the track width direction (in the X direction in the drawing).

In the magnetic sensing element shown in FIG. 14, a track width Tw is defined by the distance in the track width direction between the lower surfaces of the second antiferromagnetic layers 7.

In the magnetic sensing element shown in FIG. 14, an exchange coupling magnetic field is generated between each second antiferromagnetic layer 7 and each side region 6a of the free magnetic layer 6, and the magnetization of the side, region 6a of the free magnetic layer 6 is pinned in the X direction. The magnetization of the central region 6b of the free magnetic layer 6 is aligned in the X direction by a bias, magnetic field due to an exchange interaction in the magnetic layer, and the magnetization of the central region 6b is rotated in response to an external magnetic field. A method in which the magnetization of the free magnetic layer 6 is controlled using the antiferromagnetic layers 7 as described above is referred to as an exchange bias method.

The conventional magnetic sensing element shown in FIG. 14 has a current-perpendicular-to-the-plane (CPP) structure in which the electrodes 14 and 13 are disposed on the upper and lower surfaces of the multilayer film 11 in the thickness direction (in the Z direction), and a sensing current flows in the thickness direction of each layer of the multilayer film 11.

In the magnetic sensing element shown in FIG. 14, the insulating layers 12 cover the second antiferromagnetic layers 7. By forming the insulating layers 12, it is possible to prevent the sensing current, which flows from the upper electrode layer 14 into the multilayer film 11, from being shunted to the second antiferromagnetic layers 7.

However, the magnetic sensing element shown in FIG. 14 has the following drawback. The sensing current flowing into the multilayer film 11 expands and flows wider than the track width Tw. As a result, the effective read track width which actually contributes to the magnetoresistance effect increases, resulting in side reading and a decrease in read output. In FIG. 14, expansion of the sensing current is indicated by the arrows.

In the magnetic sensing element shown in FIG. 14, the width in the track width direction of the multilayer film 11 is wider than the track width Tw, and no insulating layer is interposed between the lower electrode layer 13 and the first antiferromagnetic layer 3. Therefore, the sensing current is considered to expand in the track width direction, particularly, in the lower part of the multilayer film 11.

FIG. 15 is a partial sectional view which shows a structure of another conventional magnetic sensing element, viewed from the surface facing a recording medium. In the magnetic sensing element shown in FIG. 15, a recess 13a is formed in each side region 13b of a lower electrode layer 13, and an insulating layer 2 is formed in the recess 13a. A first antiferromagnetic layer 3 is disposed over the insulating layers 2 and a central region 13c of the lower electrode layer 13. As in the magnetic sensing element shown in FIG. 14, insulating layers 12 are disposed on second antiferromagnetic layers 7.

As shown in FIG. 15, in each side region, the antiferromagnetic layer 3 and the electrode layer 13 are insulated from each other and the antiferromagnetic layer 7 and the electrode layer 14 are insulated from each other. Expansion in the track width direction of the sensing current in the multilayer film 11 is considered to be suppressed compared to the structure of the magnetic sensing element shown in FIG. 14.

However, in the magnetic sensing element shown in FIG. 15, expansion of the sensing current in the multilayer film 11 is still not effectively prevented, and it is not possible to improve read output properly. In FIG. 15, the flow of the sensing current is indicated by the arrows.

In the structure shown in FIG. 15, although the antiferromagnetic layers 3 and 7 and the electrode layers 13 and 14 are insulated from each other by the insulating layers 2 and 12, respectively, the width in the track width direction (in the X direction) of the multilayer film 11 is larger than the track width Tw. When the thickness of the multilayer film is larger than the mean free path, in particular, in the sensing current flowing in the vicinity of each end of the track width Tw region, conduction electrons do not necessarily move in the Z direction and have a slight angular distribution. Therefore, the current expands. Scattering (including specular scattering) at the interfaces between the layers also causes expansion of the current.

As described above, the current tends to flow wider than the track width Tw in the multilayer film 11. Therefore, in the structure shown in FIG. 15, it is not possible to suppress the expansion of the effective track width more effectively so that side reading is prevented and read output is improved.

As described above, when the exchange bias method is employed, in the structure of the conventional magnetic sensing element shown in FIG. 14 or 15, it is not possible to prevent the sensing current from expanding in the track width direction in the multilayer film 11, resulting in a decrease in read output, etc. In particular, the problem described above becomes more obvious as the track is narrowed in order to meet higher recording densities.

SUMMARY OF THE INVENTION

It is an object of the present invention to provide a CPP magnetic sensing element in which the magnetization of the free magnetic layer is controlled by an exchange bias method and in which a sensing current is prevented from expanding in the track width direction in the multilayer film while the magnetization of the free magnetic layer is properly controlled, side reading is effectively prevented, and read output is improved. It is another object of the present invention to provide a method for fabricating the magnetic sensing element.

In one aspect of the present invention, a magnetic sensing element includes a lower electrode layer; a multilayer film including a first antiferromagnetic layer, a pinned magnetic layer, a nonmagnetic material layer, and a first free magnetic layer deposited in that order on the lower electrode layer; first insulating layers disposed on both end faces in the track width direction of the multilayer film; a second free magnetic layer disposed over the first insulating layers and the first free magnetic layer; second antiferromagnetic layers disposed on both side regions of the second free magnetic layer facing the first insulating layers in the thickness direction; and an upper electrode layer disposed over the second antiferromagnetic layers and the second free magnetic layer exposed to a space between the second antiferromagnetic layers in the track width direction.

The present invention is characterized in that the first insulating layers are disposed at both sides in the track width direction of the multilayer film, the second free magnetic layer is disposed over the multilayer film and the first insulating layers, and the second antiferromagnetic layers are disposed on both side regions of the second free magnetic layer.

The magnetization of each side region of the second free magnetic layer is pinned in the track width direction by an exchange coupling magnetic field produced between the second antiferromagnetic layer and the side region. On the other hand, the exchange coupling magnetic field does not influence the central region of the second free magnetic layer, and the central region is weakly aligned in a single-domain state in the track width direction by a bias magnetic field due to the exchange interaction in the magnetic layer. The magnetization of the central region of the second free magnetic layer, together with the first free magnetic layer, is rotated sensitively in response to an external magnetic field. As described above, in the present invention, the magnetization of the free magnetic layer can be controlled properly by combining the first free magnetic layer, the second free magnetic layer, and the second antiferromagnetic layers.

In the present invention, while properly controlling the magnetization of the free magnetic layer, it is possible to effectively prevent a sensing current flowing in the multilayer film from expanding in the track width direction compared to the conventional magnetic sensing element.

The reason for this is as follows. In the conventional magnetic sensing element, the multilayer film extends to regions beneath the second antiferromagnetic layers. In contrast, in the present invention, the width in the track width direction of the multilayer film is decreased, and the first insulating layers are disposed under the second antiferromagnetic layers with the second free magnetic layer therebetween.

Consequently, because of the presence of the first insulating layers, the sensing current less easily expands in the track width direction wider than the track width Tw. The effective read track width is effectively prevented from increasing while the magnetization of the free magnetic layer is controlled properly, thus preventing side reading and improving read output. It is also possible to make the first insulating layer function as a specular scattering layer (specular layer) for conduction electrons at each end face of the multilayer film. Consequently, the CPP-GMR characteristics are prevented from being degraded in the vicinity of both end faces of the multilayer film. In particular, even when the track width Tw is 0.06 $\mu$m or less, read output is effectively prevented from being degraded.

In the present invention, preferably, each second antiferromagnetic layer is covered with a second insulating layer, and the upper electrode layer is disposed over the second insulating layers and the second free magnetic layer exposed to a space between the second insulating layers in the track width direction. Consequently, the sensing current is prevented from being shunted to the second antiferromagnetic layers, resulting in a further improvement in read output.

In the present invention, a nonmagnetic layer may be interposed between the first free magnetic layer and the second free magnetic layer.

In the present invention, preferably, a ferromagnetic layer is interposed between the second free magnetic layer and each second antiferromagnetic layer. Consequently, the magnetization of the second free magnetic layer can be more properly controlled. That is, when an exchange coupling magnetic field having a proper magnitude is produced between the second antiferromagnetic layer and the ferromagnetic layer and the magnetization of the ferromagnetic layer is pinned in the track width direction, the magnetization of each side region of the second free magnetic layer facing the ferromagnetic layer is properly pinned in the track width direction due to an exchange interaction with the ferromagnetic layer.

In the present invention, preferably, the upper surface of the second free magnetic layer is, exposed to a space between the second antiferromagnetic layers in the track width direction, and a nonmagnetic layer is disposed on the exposed upper surface. The nonmagnetic layer functions as an oxidation-inhibiting layer to prevent the second free magnetic layer from being oxidized in the fabrication process.

In the present invention, a third antiferromagnetic layer may be disposed on the second free magnetic layer, and the second antiferromagnetic layers may be disposed on both side regions of the third antiferromagnetic layer.

Although the third antiferromagnetic layer has a small thickness which does not exhibit antiferromagnetism alone, by superposing the second antiferromagnetic layer on each side region of the third antiferromagnetic layer, an antiferromagnetic layer exhibiting antiferromagnetism properly is formed in each side region. An exchange coupling magnetic field with a proper magnitude is produced between the side region of the second free magnetic layer and the side region of the antiferromagnetic layer, and the magnetization of the side region of the second free magnetic layer can be pinned in the track width direction more properly.

Preferably, the upper surface of the third antiferromagnetic layer is exposed to a space between the second antiferromagnetic layers in the track width direction, and a nonmagnetic layer is disposed on the exposed upper surface. The nonmagnetic layer functions as an oxidation-inhibiting layer to prevent the third antiferromagnetic layer from being oxidized in the fabrication process.

In the present invention, preferably, the nonmagnetic layer is composed of at least one of Ru, Re, Pd, Os, Ir, Pt, Au, Rh, Cu, and Cr.

In the present invention, preferably, the lower electrode layer functions as a lower shielding layer, and the upper electrode layer functions as an upper shielding layer. Consequently, a gap length defined by the distance between the shielding layers can be decreased, and it is possible to fabricate a magnetic sensing element which is suitable for higher recording densities.

In another aspect of the present invention, a method for fabricating a magnetic sensing element includes the steps of:

(a) forming a multilayer film on a lower electrode layer, the multilayer film comprising a first antiferromagnetic layer, a pinned magnetic layer, a nonmagnetic material layer, and a first free magnetic layer deposited in that order from the bottom;

(b) trimming both end faces in the track width direction of the multilayer film and forming first insulating layers on the end faces;

(c) forming a second free magnetic layer over the first insulating layers and the first free magnetic layer;

(d) forming second antiferromagnetic layers on both side regions of the second free magnetic layer facing the first insulating layers in the thickness direction; and (e) forming an upper electrode layer over the second antiferromagnetic layers and the second free magnetic layer exposed to a space between the antiferromagnetic layers in the track width direction.

In the present invention, by employing the fabrication method described above, the first insulating layers can be formed at both sides in the track width direction of the multilayer film, and the second free magnetic layer can be formed over the first insulating layers and the first free magnetic layer. Consequently, the magnetization of the free magnetic layer can be properly controlled and it is possible to effectively prevent a sensing current from expanding wider than the track width Tw when flowing through the multilayer film. Therefore, it is possible to easily and properly fabricate a magnetic sensing element with a higher read output compared to the conventional case.

In the present invention, preferably, a step of covering the second antiferromagnetic layers with second insulating layers is included between the steps (d) and (e), and in the step (e), the upper electrode layer is formed over the second insulating layers and the second free magnetic layer exposed to a space between the second antiferromagnetic layers in the track width direction. By providing the second insulating layers, the sensing current is properly prevented from being shunted to the second antiferromagnetic layers, and it is possible to fabricate a magnetic sensing element having a high read output more effectively.

In the present invention, preferably, in the step (a), a nonmagnetic layer is formed on the top of the multilayer film, and in the step (c), before the second free magnetic layer is formed, the nonmagnetic layer is at least partially removed. The nonmagnetic layer functions as an oxidation-inhibiting layer to prevent the layer thereunder from being oxidized.

In the present invention, preferably, in the step (c), a nonmagnetic layer is formed on the second free magnetic layer, and after the nonmagnetic layer located in regions corresponding to the first insulating layers in the thickness direction is removed, ferromagnetic layers are formed on both side regions of the second free magnetic layer, and in the step (d), the second antiferromagnetic layers are formed on the ferromagnetic layers. The nonmagnetic layer functions as an oxidation-inhibiting layer to prevent the second free magnetic layer from being oxidized in the fabrication process. Since the ferromagnetic layer and the second antiferromagnetic layer are continuously deposited, an exchange coupling magnetic field with a predetermined magnitude can be produced between the ferromagnetic layer and the second antiferromagnetic layer. Therefore, the magnetization of the second free magnetic layer can be controlled more properly.

In the present invention, preferably, after the step (c), a third antiferromagnetic layer is formed on the second free magnetic layer, and after a nonmagnetic layer is formed on the third antiferromagnetic layer, the nonmagnetic layer located in regions corresponding to the first insulating layers in the thickness direction is removed, and in the step (d), the second antiferromagnetic layers are formed on the side regions of the third antiferromagnetic layer. The nonmagnetic layer functions as an oxidation-inhibiting layer to prevent the third antiferromagnetic layer from being oxidized in the fabrication process.

In the present invention, preferably, the third antiferromagnetic layer is formed at a thickness of 20 to 50 Å. By forming the third antiferromagnetic layer with such a small thickness, although the third antiferromagnetic layer does not exhibit antiferromagnetism alone, in the side regions of the third antiferromagnetic layer on which the second antiferromagnetic layers are superposed, antiferromagnetism is exhibited. Consequently, an exchange coupling magnetic field with a proper magnitude is produced between each side region of the second free magnetic layer and each side region of the antiferromagnetic layer, and the magnetization of the second free magnetic layer can be more effectively controlled.

In the present invention, preferably, the nonmagnetic layer is composed of at least one of Ru, Re, Pd, Os, Ir, Pt, Au, Rh, Cu, and Cr, and preferably, the nonmagnetic layer is deposited at a thickness of 3 to 20 Å. If the nonmagnetic layer is composed of Ru or the like, the nonmagnetic layer properly functions as an oxidation-inhibiting layer even with a small thickness. Moreover, because of the small thickness of the nonmagnetic layer, the nonmagnetic layer can be removed by ion milling with low energy, and the layer beneath the nonmagnetic layer can be prevented from being affected by the ion milling process.

In the present invention, a method for fabricating a magnetic sensing element may include, instead of the step (d), the steps of:

(f) forming a second antiferromagnetic layer and a second insulating layer on the second free magnetic layer; and (g) forming a mask layer on the side regions of the second insulating layer corresponding to the first insulating layers in the thickness direction, and removing the central regions of the second insulating layer and the second antiferromagnetic layer not covered with the mask layer to expose the upper surface of the second free magnetic layer to a space between the side regions of the second insulating layer.

By employing the fabrication method including the steps (f) and (g), a desired magnetic sensing element can be fabricated most simply.

In the step (g), the central region of the second antiferromagnetic layer may be trimmed off halfway, and in the step (e), the upper electrode layer may be formed over the side regions of the second insulating layer and the second antiferromagnetic layer exposed to a space between the side regions of the second insulating layer. In such a case, the thickness of the second antiferromagnetic layer remaining in the central region is preferably 50 Å or less. Consequently, the central region of the remaining second antiferromagnetic layer ceases to exhibit antiferromagnetism, and the magnetization of the free magnetic layer can be controlled so that the central region of the second free magnetic layer is properly rotated in response to an external magnetic field.

DESCRIPTION OF THE PREFERRED EMBODIMENTS

Figure 1:
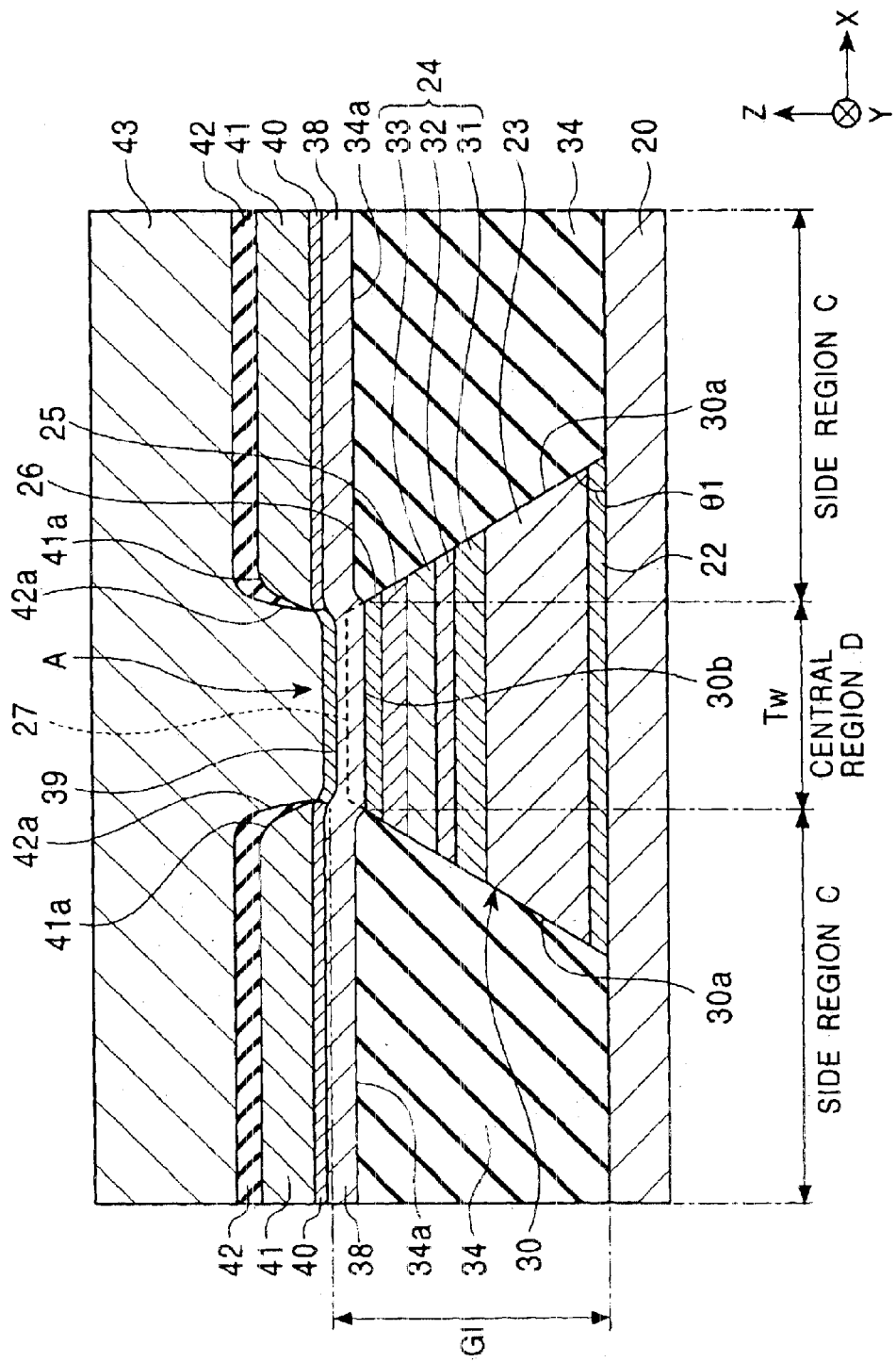
FIG. 1 is a partial sectional view which shows a structure of a magnetic sensing element in a first embodiment of the present invention, viewed from the surface facing a recording medium.

FIG. 1 is a partial sectional view which shows a structure of a magnetic sensing element in a first embodiment of the present invention, viewed from the surface facing a recording medium. The magnetic sensing element shown in FIG. 1 is a MR head for reading signals recorded in the recording medium. An inductive head for writing may be deposited on the MR head. The surface facing the recording medium is, for example, perpendicular to the plane of the thin film constituting the magnetic sensing element and parallel to the magnetization directions of free magnetic layers of the magnetic sensing element in the absence of an applied external magnetic field (recording signal magnetic field). In FIG. 1, the surface facing the recording medium is parallel to the X-Z plane.

Additionally, when the magnetic sensing element is used for a floating-type magnetic head, the surface facing the recording medium corresponds to a so-called "air bearing surface (ABS)".

The magnetic sensing element is formed on the trailing end of a slider, for example, composed of alumina-titanium carbide ($Al_2O_3$—TiC). The slider is connected to an elastically deformable support composed of a stainless steel or the like at a surface opposite to the surface facing the recording medium, and thus a magnetic head device is fabricated.

The track width direction means the width direction of a region of which magnetization is rotated by the external magnetic field, and for example, the magnetization direction of the free magnetic layer in the absence of an applied external magnetic field, i.e., in the X direction in the drawing. The track width Tw of the magnetic sensing element is defined by the width in the track width direction of the free magnetic layer.

The recording medium travels in the Z direction. The leakage magnetic field from the recording medium is oriented in the Y direction.

Referring to FIG. 1, a multilayer film 30 is disposed on a lower shielding layer 20 composed of a magnetic material, such as a NiFe alloy.

As shown in FIG. 1, in the multilayer film 30, a seed layer 22, a first antiferromagnetic layer 23, a pinned magnetic layer 24, a nonmagnetic material layer 25, and a first free magnetic layer 26 are deposited in that order from the bottom.

The seed layer 22 is composed of a NiFe alloy, a NiFeCr alloy, Cr, or the like. For example, the seed layer 22 is composed of $(Ni_{0.8}Fe_{0.2})_{60\ at\ \%}Cr_{40\ at\ \%}$ with a thickness of 60 Å.

The first antiferromagnetic layer 23 is composed of a PtMn alloy, X—Mn alloy, wherein X is at least one element selected from the group consisting of Pd, Ir, Rh, Ru, Os, Ni, and Fe, or Pt—Mn—X' alloy, wherein X' is at least one element selected from the group consisting of Pd, Ir, Rh, Ru, Au, Ag, Os, Cr, Ni, Ar, Ne, Xe, and Kr.

By using such an alloy for the first antiferromagnetic layer 23 and performing an annealing process, an exchange coupled film of the first antiferromagnetic layer 23 and the pinned magnetic layer 24 producing a large exchange coupling magnetic field is obtained. In particular, by using the PtMn alloy, it is possible to obtain an exchange coupled film of the first antiferromagnetic layer 23 and the pinned magnetic layer 24 which produces an exchange coupling magnetic field of 48 kA/m or more, for example, exceeding 64 kA/m, and which has a significantly high blocking temperature of 380° C., the blocking temperature being a temperature at which the exchange coupling magnetic field is lost.

Although the alloys described above have a disordered face-centered cubic (fcc) structure immediately after being deposited, the structure is transformed into a CuAuI-type ordered face-centered tetragonal (fct) structure by annealing. The first antiferromagnetic layer 23 has a thickness of 80 to 300 Å.

The pinned magnetic layer 24 shown in FIG. 1 has a synthetic ferrimagnetic structure. The pinned magnetic layer 24 has a triple-layered structure including magnetic sublayers 31 and 33 and an intermediate nonmagnetic sublayer 32.

The magnetic sublayers 31 and 33 are composed of magnetic materials, for example, selected from the group consisting of NiFe alloys, Co, CoNiFe alloys, CoFe alloys, and CoNi alloys. Preferably, the magnetic sublayers 31 and 33 are composed of the same material.

The intermediate nonmagnetic sublayer 32 is composed of at least one of Ru, Rh, Ir, Cr, Re, and Cu, and preferably is composed of Ru.

Each of the magnetic sublayers 31 and 33 has a thickness of approximately 10 to 70 Å. The intermediate nonmagnetic sublayer 32 has a thickness of approximately 3 to 10 Å.

Additionally, the pinned magnetic layer 24 may have a single-layer structure composed of any one of the magnetic materials described above, or a double-layer structure including a layer composed of any one of the magnetic materials described above and a diffusion-preventing layer, such as a Co layer.

The nonmagnetic material layer 25 prevents magnetic coupling between the pinned magnetic layer 24 and the first free magnetic layer 26. A sensing current mainly flows through the nonmagnetic material layer 25. Preferably, the nonmagnetic material layer 25 is composed of a conductive, nonmagnetic material, such as Cu, Cr, Au, or Ag. More preferably, the nonmagnetic material layer 25 is composed of Cu. The nonmagnetic material layer 25 has a thickness of, for example, approximately 18 to 50 Å.

When the magnetic sensing element shown in FIG. 1 is a tunneling magnetoresistive element (TMR element) using the principle of the spin-tunneling effect, the nonmagnetic material layer 25 is composed of an insulating material, such as $Al_2O_3$.

In the embodiment shown in FIG. 1, the first free magnetic layer 26 has a single-layer structure. The first free magnetic layer 26 is composed of a NiFe alloy or the like. The first free magnetic layer 26 may have a double-layer structure. In such a case, preferably, the double-layer structure includes a diffusion-preventing layer composed of Co or CoFe for preventing interdiffusion with the nonmagnetic material layer 25, and a magnetic layer composed of a NiFe alloy or the like disposed on the diffusion-preventing layer. The first free magnetic layer 26 has a thickness of approximately 30 to 50 Å.

In this embodiment, a nonmagnetic layer 27 (indicated by the dotted line in FIG. 1) may be disposed on the first free magnetic layer 26. The nonmagnetic layer 27 is preferably composed of at least one element selected from the group consisting of Cu, Ru, Re, Pd, Os, Ir, Pt, Au, Rh, and Cr. More preferably, Cu or Ru is selected from the group. The nonmagnetic layer 27 has a thickness of, for example, 6 to 11 Å. If the nonmagnetic layer 27 has such a small thickness, exchange coupling is produced between the first free magnetic layer 26 and a second free magnetic layer 38, which will be described below, due to the RKKY interaction, and the magnetization directions of the first free magnetic layer 26 and the second free magnetic layer 38 become parallel to the track width direction (the X direction) and antiparallel to each other.

On the other hand, if the thickness of the nonmagnetic layer 27 is less than 6 Å, the magnetizations of the first free magnetic layer 26 and the second free magnetic layer 38 are aligned in the track width direction (in the X direction) and in the same direction. In the embodiment shown in FIG. 1, a laminate from the seed layer 22 to the nonmagnetic layer 27 (or the first free magnetic layer 26 when the nonmagnetic layer 27 is not disposed) is referred to as a multilayer film 30.

In the embodiment shown in FIG. 1, end faces 30a of the multilayer film 30 are formed as inclined planes or curved planes in which the width in the track width direction (in the X direction) of the multilayer film 30 gradually decreases upward (in the Z direction).

As shown in FIG. 1, first insulating layers 34 are disposed on the protruding sections of the lower shielding layer 20 extending in the track width direction (in the X direction) wider than the width in the track width direction of the multilayer film 30 and the first insulating layers 34 extend along the end faces 30a of the multilayer film 30. The first insulating layers 34 are composed of an insulating material, such as $Al_2O_3$ or $SiO_2$.

In the embodiment shown in FIG. 1, the second free magnetic layer 38 is disposed over the first free magnetic layer 26 which is the top layer of the multilayer film 30 (or the nonmagnetic layer 27 when provided) and over the first insulating layers 34 extending in the track width direction at both sides of the multilayer film 30. The second free magnetic layer 38 is composed of a NiFe alloy or the like as in the first free magnetic layer 26. Although the second free magnetic layer 38 in the embodiment shown in FIG. 1 has a single-layer structure, a multilayer structure including two or more layers may be acceptable.

In the embodiment shown in FIG. 1, a nonmagnetic layer 39 is disposed on a central region D of the second free magnetic layer 38, and ferromagnetic layers 40 are disposed at both sides in the track width direction (in the X direction) of the nonmagnetic layer 39 and over side regions C of the second free magnetic layer 38. The ferromagnetic layer 40 is composed of a known magnetic material, such as CoFe, CoFeNi, NiFe, or Co.

A second antiferromagnetic layer 41 is disposed on each ferromagnetic layer 40. Preferably, the second antiferromagnetic layer 41 is composed of a PtMn alloy, X—Mn alloy, or Pt—Mn—X' alloy, wherein X is at least one element selected from the group consisting of Pd, Ir, Rh, Ru, Os, Ni, and Fe, and X' is at least one element selected from the group consisting of Pd, Ir, Rh, Ru, Au, Ag, Os, Cr, Ni, Ar, Ne, Xe, and Kr, as in the first antiferromagnetic layer 23.

In the embodiment shown in FIG. 1, second insulating layers 42 are disposed on the second antiferromagnetic layers 41. The second insulating layer 42 is composed of an insulating material, such as $Al_2O_3$ or $SiO_2$, as in the first insulating layer 34.

In the embodiment shown in FIG. 1, an upper shielding layer 43 composed of a magnetic material, such as a NiFe alloy, is disposed over the second insulating layers 42 and the nonmagnetic layer 39 exposed to a space A between the second antiferromagnetic layers 41.

The magnetic sensing element shown in FIG. 1 has a current-perpendicular-to-the-plane (CPP) structure in which the shielding layers 43 and 20 which also function as electrodes are disposed on the upper and lower surfaces of the multilayer film 30, and a sensing current applied from the shielding layer 20 or 43 flows through the multilayer film 30 in the thickness direction of each layer.

The features of the magnetic sensing element shown in FIG. 1 will now be described. In the embodiment shown in FIG. 1, the end faces 30a of the multilayer film 30 is formed as inclined planes or curved planes such that the width in the track width direction (in the X direction) of the multilayer film 30 gradually decreases upward (in the Z direction), and the first insulating layers 34 are disposed at both sides in the track width direction of the end faces 30a.

The second free magnetic layer 38 is disposed over the first insulating layers 34 and the first free magnetic layer 26 (the nonmagnetic layer 27 when provided), the second antiferromagnetic layers 41 are disposed above both side regions C of the second free magnetic layer 38 opposed to the first insulating layers 34 in the thickness direction (in the Z direction). Herein, "the side region C" refers to a region beneath the second antiferromagnetic layer 41, and "the central region D" refers to a region between the antiferromagnetic layers 41 in the track width direction.

In the embodiment shown in FIG. 1, when the magnetization the ferromagnetic layer 40 formed on the second free magnetic layer 38 is pinned in the X direction by an exchange coupling magnetic field produced between the second antiferromagnetic layer 41 and the ferromagnetic layer 40, the magnetization of each side region of the second free magnetic layer 38 extending in the track width direction from the end face of the multilayer film 30 is pinned in the X direction by an exchange interaction between the ferromagnetic layer 40 and the second free magnetic layer 38.

On the other hand, since the central region D of the second free magnetic layer 38 is not provided with the second antiferromagnetic layer 41 thereon, the magnetization is not pinned, and the central region D of the second free magnetic layer 38 is weakly aligned in a single-domain state in the X direction by a bias magnetic field due to the exchange interaction between the side region C and the inside of the magnetic layer. The magnetization of the central region D of the second free magnetic layer 38 is properly rotated by an external magnetic field.

The first free magnetic layer 26 is also weakly aligned in a single-domain state in the same direction as in the second free magnetic layer 38 by the exchange interaction in the magnetic layer when the nonmagnetic layer 27 is not provided between the second free magnetic layer 38 and the first free magnetic layer 26 or when the nonmagnetic layer 27 with a thickness of less than 6 Å is provided. The magnetization of the first free magnetic layer 26, together with the central region D of the second free magnetic layer 38, is rotated sensitively in response to an external magnetic field.

When a nonmagnetic layer 27 with a thickness of approximately 6 to 11 Å is provided between the central region of the second free magnetic layer and the first free magnetic layer 26, exchange coupling is produced due to the RKKY interaction between the second free magnetic layer 38 and the first free magnetic layer 26. The first free magnetic layer 26 is magnetized in a direction opposite to the magnetization direction of the second free magnetic layer 38, and the magnetization of the first free magnetic layer 26 is rotated sensitively in response to an external magnetic field while maintaining the state antiparallel to the magnetization of the central region D of the second free magnetic layer 38.

As described above, in the embodiment shown in FIG. 1, by combining the first free magnetic layer 26, the second free magnetic layer 38 extending beyond both ends in the track width direction of the multilayer film 30, the ferromagnetic layers 40 disposed on the side regions C of the second free magnetic layer 38, and the second antiferromagnetic layers 41, the magnetization of the free magnetic layer can be controlled properly.

In the embodiment shown in FIG. 1, while properly controlling the magnetization of the free magnetic layer, by employing the following construction, it is possible to effectively prevent a sensing current, which flows from one of the shielding layers 20 and 43 into the multilayer film 30, from expanding wider than the track width Tw compared to the conventional magnetic sensing element.

That is, in the embodiment shown in FIG. 1, the end faces 30a in the track width direction (in the X direction) of the multilayer film 30 is trimmed by etching or the like, and the length of the multilayer film 30 extending below the second antiferromagnetic layers is decreased. The first insulating layers 34 joining to the end faces 30a of the multilayer film 30 are disposed below the side regions C of the second antiferromagnetic layers 41.

Consequently, because of the presence of the first insulating layers 34, it is possible to prevent the sensing current, which flows from one of the shielding layers 20 and 43 into the multilayer film 30, from expanding wider than the track width Tw, and expansion of the effective read track width can be suppressed compared to the conventional case, thus preventing side reading. Therefore, it is possible to fabricate a CPP magnetic sensing element employing the exchange bias method in which high read output is obtained.

As described above, in the present invention, in a CPP magnetic sensing element employing the exchange bias method, the magnetization of the free magnetic layer is properly controlled, and the sensing current flowing into the multilayer film 30 can be prevented from expanding wider than the track width Tw. Therefore, a magnetic sensing element with a high read output can be fabricated.

Figure 14:
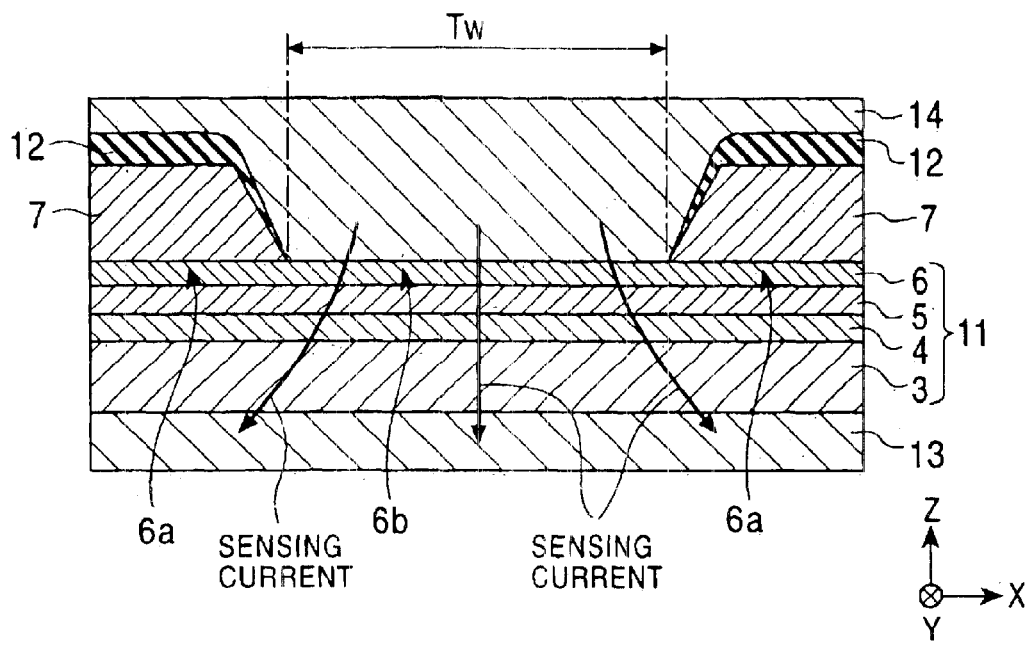
FIG. 14 is a partial sectional view which shows a structure of a conventional magnetic sensing element, viewed from the surface facing a recording medium.
Figure 15:
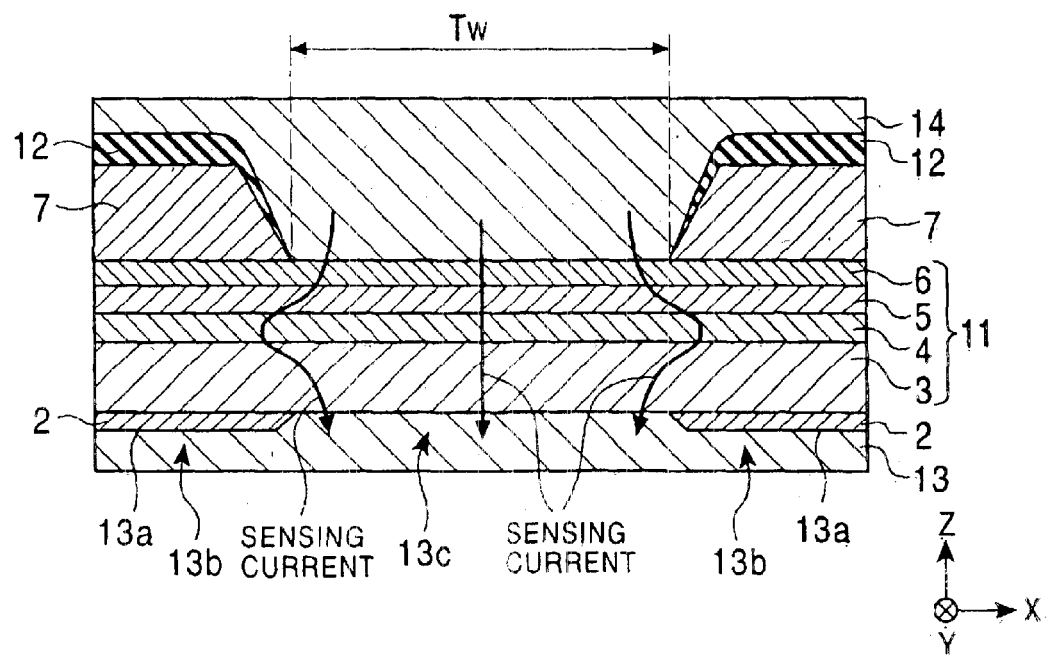
FIG. 15 is a partial sectional view which shows a structure of another conventional magnetic sensing element, viewed from the surface facing a recording medium.

In particular, when track narrowing is promoted to meet higher recording densities, in the conventional structure shown in FIG. 14 or 15, since the ratio of the amount of the sensing current flowing wider than the track width to the amount of the sensing current flowing within the track width tends to increase, expansion of the effective track width and a decrease in read output give rise to considerable problems. In contrast, in the embodiment shown in FIG. 1, the sensing current which flows wider than the track width can be effectively suppressed compared to the conventional structure, and therefore as the track is narrowed, it is possible to provide a magnetic sensing element with a higher read output effectively compared with the structure shown in FIG. 14 or 15.

The track width Tw is defined by the distance between the lower surfaces of the second antiferromagnetic layers 41. The track width Tw is, for example, approximately 0.06 to 0.2 μm although it depends on the specifications of the memory device (track pitch, track density, etc.). The track width Tw is also referred to as an optical track width. Preferably, the effective read track width which actually contributes to the magnetoresistance effect is substantially the same as the optical track width.

If the angle θ1 between the lower surface of the multilayer film 30 and the end face 30a is small, the lower part of the multilayer film 30 becomes wider in the track width direction. Consequently, the sensing current easily flows wider than the track width in the lower part of the multilayer film 30, and the effective read track width tends to be increased. Therefore, a larger angle θ1 is desirable, and the angle θ1 is preferably 60° to 90°.

Preferably, each first insulating layer 34 shown in FIG. 1 covers the entire end face 30a, and the upper surface 34a of the first insulating layer 34 is flush with or slightly higher than the upper surface 30b of the multilayer film 30. By properly covering the entire end faces 30a of the multilayer film 30 with the first insulating layers 34, the sensing current is more properly prevented from expanding wider than the track width Tw.

In the embodiment shown in FIG. 1, the second insulating layer 42 is disposed over each second antiferromagnetic layer 41. By covering the second antiferromagnetic layer with the second insulating layer 42, the sensing current is properly prevented from being shunted to the second antiferromagnetic layer 41. Consequently, it is possible to provide a magnetic sensing element in which read output can be further improved.

Preferably, the second insulating layer 42 completely covers the inner end face 41a of each antiferromagnetic layer 41 and extends to each end of the nonmagnetic layer 39 exposed between the space A between the second antiferromagnetic layers 41. Consequently, the sensing current is prevented from being shunted to the second antiferromagnetic layers 41 most effectively. Additionally, the second insulating layers 42 may be omitted in the embodiment shown in FIG. 1.

In the embodiment shown in FIG. 1, the ferromagnetic layer 40 is disposed on each side region C of the second free magnetic layer 38, and the second antiferromagnetic layer 41 is disposed on the ferromagnetic layer 40. According to a fabrication method which will be described later, by employing such a construction, the magnetization of the side region C of the second free magnetic layer can be pinned in the X direction more reliably. This is because of the fact that the ferromagnetic layer 40 and the second antiferromagnetic layer 41 can be continuously deposited by sputtering. An exchange coupling magnetic field with a proper magnitude is produced between the ferromagnetic layer 40 and the second antiferromagnetic layer 41 by continuous sputtering, and the magnetization of the ferromagnetic layer 40 can be pinned in the X direction. As a result, the magnetization of the side region C of the second free magnetic layer 38 which is disposed under the ferromagnetic layer 40 is more properly pinned in the X direction by an exchange interaction between the ferromagnetic layer 40 and the side region C of the second free magnetic layer 38. In the embodiment shown in FIG. 1, the magnetization of the second free magnetic layer 38 can be controlled more properly.

In the embodiment shown in FIG. 1, the central region D of the second free magnetic layer 38 is exposed to the space A in the track width direction (in the X direction) between the second antiferromagnetic layers 41, and the nonmagnetic layer 39 is formed on the upper surface of the exposed second free magnetic layer 38. The nonmagnetic layer 39 may be also interposed between each side region C of the second free magnetic layer 38 and each ferromagnetic layer 40.

If the thickness of the nonmagnetic layer 39 interposed between the side region C of the second free magnetic layer 38 and the ferromagnetic layer 40 is approximately 6 to 11 Å, exchange coupling due to the RKKY interaction occurs between the side region C of the second free magnetic layer 38 and the ferromagnetic layer 40, and the magnetizations of the side region C of the second free magnetic layer 38 and the ferromagnetic layer 40 are pinned antiparallel to each other. On the other hand, if the thickness of the nonmagnetic layer 39 is less than 6 Å, the magnetizations of the side region C of the second free magnetic layer 38 and the ferromagnetic layer 40 are pinned in the same direction.

The nonmagnetic layer 39 is composed of, preferably, at least one of Ru, Rh, Ir, Cr, Re, and Cu, and more preferably Ru. If the nonmagnetic layer 39 is composed of a nonmagnetic material, such as Ru, even if the nonmagnetic layer 39 is deposited at a small thickness of approximately 3 to 20 Å, the nonmagnetic layer 39 can be made to function as an oxidation-inhibiting layer properly. Moreover, the nonmagnetic layer 39 can be removed by ion milling with low energy, and the influence of the milling step on the layer beneath the nonmagnetic layer 39 can be minimized.

In the embodiment shown in FIG. 1, when the nonmagnetic layer 27 is not interposed between the first free magnetic layer 26 and the second free magnetic layer 38, the first free magnetic layer 26 and the second free magnetic layer 38 function as a combined free magnetic layer, and the thickness of the side region C of the free magnetic layer is smaller than the thickness of the central region D of the free magnetic layer.

By decreasing the thickness of the side region C of the free magnetic layer as described above, it is possible to decrease the static magnetic field produced in the side region C, and it is possible to decrease the magnetic flux density in the central region of the free magnetic layer resulting from the static magnetic field produced in the side region of the free magnetic layer. Consequently, the insensitive area generated in the central region can be decreased, resulting in an improvement in the magnetic field sensitivity. (The insensitive area is not easily rotated in response to an external magnetic field and does not substantially contribute to the magnetoresistance effect.)

In the embodiment shown in FIG. 1, the first free magnetic layer 26 in the multilayer film 30 is an indispensable layer. When the first free magnetic layer 26 is provided, the effect described above, i.e., a decrease in magnetic flux density, is expected. However, even when such an effect is not expected, for example, when the nonmagnetic layer 27 remains between the first free magnetic layer 26 and the central region D of the second free magnetic layer 28, if the first free magnetic layer 26 is not provided, in a fabrication method described below, the upper surface of the nonmagnetic material layer 25 may be influenced by ion milling or the nonmagnetic layer 27 may remain on the upper surface of the nonmagnetic material layer 25. Consequently, electron scattering or a spin-tunneling effect does not occur effectively, resulting in a decrease in read characteristics.

As shown in FIG. 1, preferably, the first free magnetic layer 26 is formed in the multilayer film 30. However, in a CPP-GMR which is designed so that a magnetoresistance effect is exhibited using spin-dependent bulk scattering in the magnetic layer rather than spin-dependent scattering at the interface, even damage to the interface due to ion milling may be acceptable. In such a case, the free magnetic layer 26 may be omitted.

On the other hand, in a tunneling magnetoresistive element, since the thickness of the nonmagnetic material layer 25 is small at several angstroms, milling damage is not acceptable, and the first free magnetic layer 26 is indispensable.

In the embodiment shown in FIG. 1, the lower shielding layer 20 and the upper shielding layer 43 function as both shielding layers and electrodes. Although electrodes layers may be provided at the positions in which the lower shielding layer 20 and the upper shielding layer 43 are disposed, if the shielding layers 20 and 43 are also made to function as electrodes, the distance between the shielding layers 20 and 43 can be decreased, resulting in a decrease in a gap length Gl. This is desirable because it is possible to fabricate a magnetic sensing element which can cope with higher recording densities.

Figure 2:
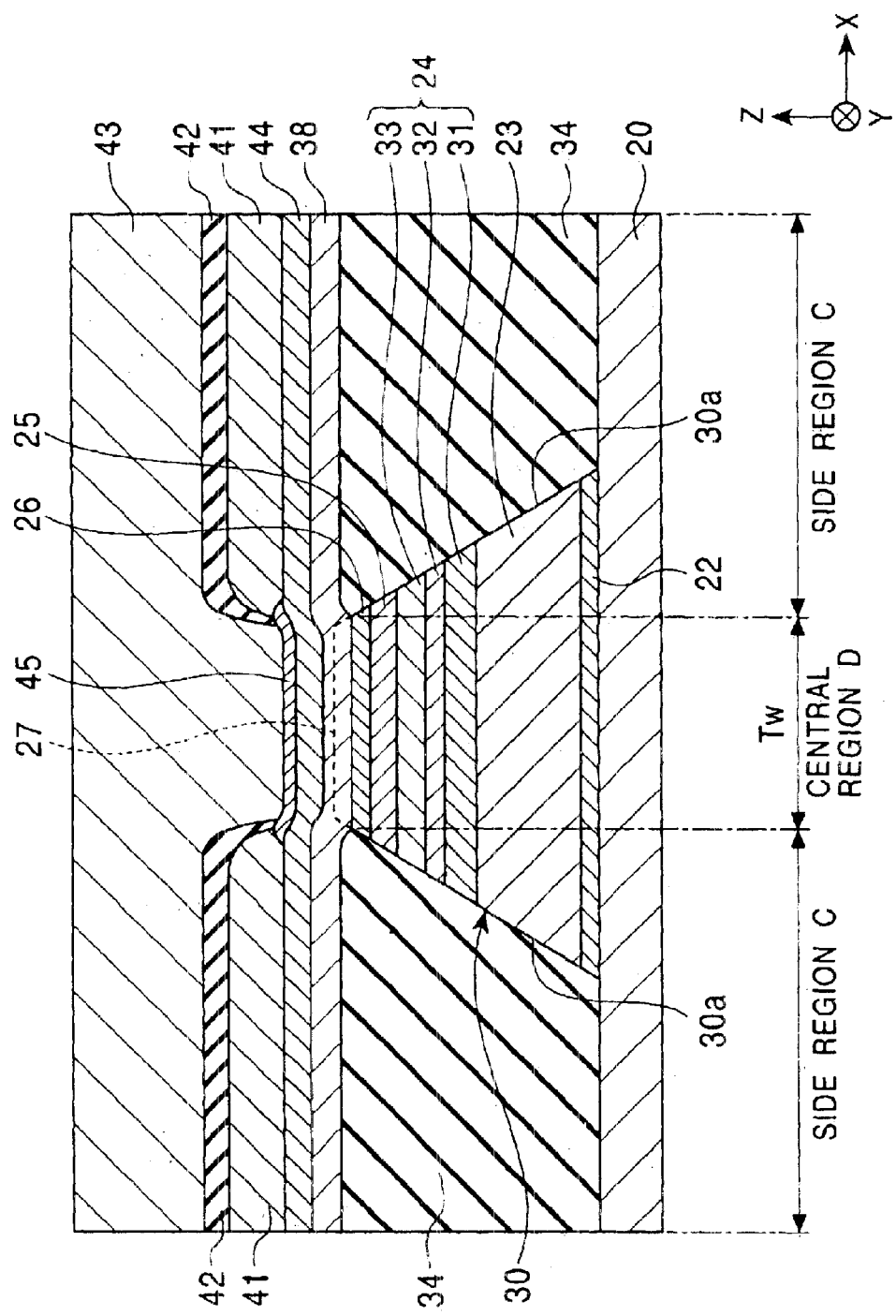
FIG. 2 is a partial sectional view which shows a structure of a magnetic sensing element in a second embodiment of the present invention, viewed from the surface facing a recording medium.

FIG. 2 is a partial sectional view which shows a magnetic sensing element in a second embodiment of the present invention, viewed from the surface facing a recording medium. The same layers as those in the sensing element shown in FIG. 1 are represented by the same reference numerals.

The embodiment shown in FIG. 2 differs from the embodiment shown in FIG. 1 in that a third antiferromagnetic layer 44 is disposed on a second free magnetic layer 38, and a second antiferromagnetic layer 41 and a second insulating layer 42 are disposed on each side region C of the third antiferromagnetic layer 44.

Preferably, the third antiferromagnetic layer 44 has a thickness of 20 to 50 Å. By setting the thickness of the third antiferromagnetic layer 44 to be small at 50 Å or less, the third antiferromagnetic layer 44 does not exhibit antiferromagnetism when deposited, and even when an annealing process is performed in a magnetic field, the third antiferromagnetic layer 44 is not easily transformed into an ordered structure. As a result, an exchange coupling magnetic field is not produced between the third antiferromagnetic layer 44 and the second free magnetic layer 38, or even an exchange coupling magnetic field is produced, the magnitude thereof is small, and the entire magnetization of the second free magnetic layer 38 is not strongly pinned as in the pinned magnetic layer 24.

The reason for setting the thickness of the third antiferromagnetic layer 44 at 20 Å or more is that if the thickness is less than 20 Å, even when the second antiferromagnetic layer 41 is disposed on the side region C of the third antiferromagnetic layer 44, the side region C of the third antiferromagnetic layer 44 does not easily exhibit antiferromagnetism, and an exchange coupling magnetic field with a proper magnitude is not produced between the third antiferromagnetic layer 44 and each side region C of the second free magnetic layer 38.

In the embodiment shown in FIG. 2, the magnetization of the side region C of the second free magnetic layer 38 is pinned in the X direction more reliably by an exchange coupling magnetic field produced between the side region C of the third antiferromagnetic layer 44 and the side region C of the second free magnetic layer 38, and the central region C of the second free magnetic layer 38 is weakly aligned in a single-domain state such that the magnetization of the central region D of the second free magnetic layer 38 can be rotated in response to an external magnetic field.

In the embodiment shown in FIG. 2, as in the embodiment shown in FIG. 1, the magnetization of the free magnetic layer can be controlled properly. The end faces 30a of the multilayer film 30 in the track width direction (in the X direction) are trimmed by etching or the like, and the length of the multilayer film 30 extending below the second antiferromagnetic layer 41 is decreased compared to the conventional case. First insulating layers 34 joining to the end faces 30a of the multilayer film 30 are disposed below the side regions C of the second antiferromagnetic layers 41.

Consequently, because of the presence of the first insulating layers 34, it is possible to prevent the sensing current, which flows from one of the shielding layers 20 and 43 into the multilayer film 30, from expanding wider than the track width Tw, and expansion of the effective read track width can be suppressed compared to the conventional case, thus preventing side reading. Therefore, it is possible to produce a CPP magnetic sensing element employing the exchange bias method in which high read output is obtained.

As described above, in the present invention, in a CPP magnetic sensing element employing the exchange bias method, the magnetization of the free magnetic layer is properly controlled, and the sensing current flowing into the multilayer film 30 can be prevented from expanding wider than the track width Tw. Therefore, a magnetic sensing element with a high read output can be fabricated.

In the embodiment shown in FIG. 2, a nonmagnetic layer 45 is disposed on the central region D of the third antiferromagnetic layer 44, and the nonmagnetic layer 45 is an oxidation-inhibiting layer to prevent the third antiferromagnetic layer 44 from being oxidized in the fabrication process. The nonmagnetic layer 45 is composed of, preferably, at least one noble metal selected from the group consisting of Ru, Re, Pd, Os, Ir, Pt, Au, and Rh, or Cr. The nonmagnetic layer 45 is deposited at a small thickness of approximately 3 to 20 Å, and the nonmagnetic layer 45 on each side region C of the third antiferromagnetic layer 44 is removed by ion milling or the like. The second antiferromagnetic layer 41 is formed on the side region C of the third antiferromagnetic layer 44. In the embodiment shown in FIG. 2, the nonmagnetic layer 45 formed on the side region C of the third antiferromagnetic layer 44 is entirely removed, and the nonmagnetic layer 45 remains only on the central region D of the third antiferromagnetic layer 44. However, the nonmagnetic layer 45 is preferably partially left on the side region C of the third antiferromagnetic layer 44 at a thickness of 3 Å or less. By decreasing the thickness of the nonmagnetic layer 45 to such an extent, the side region C of the third antiferromagnetic layer 44 can exhibit antiferromagnetism, and it is possible to produce an exchange coupling magnetic field with a proper magnitude between the side region C of the third antiferromagnetic layer 44 and the side region C of the second free magnetic layer 38.

Figure 3:
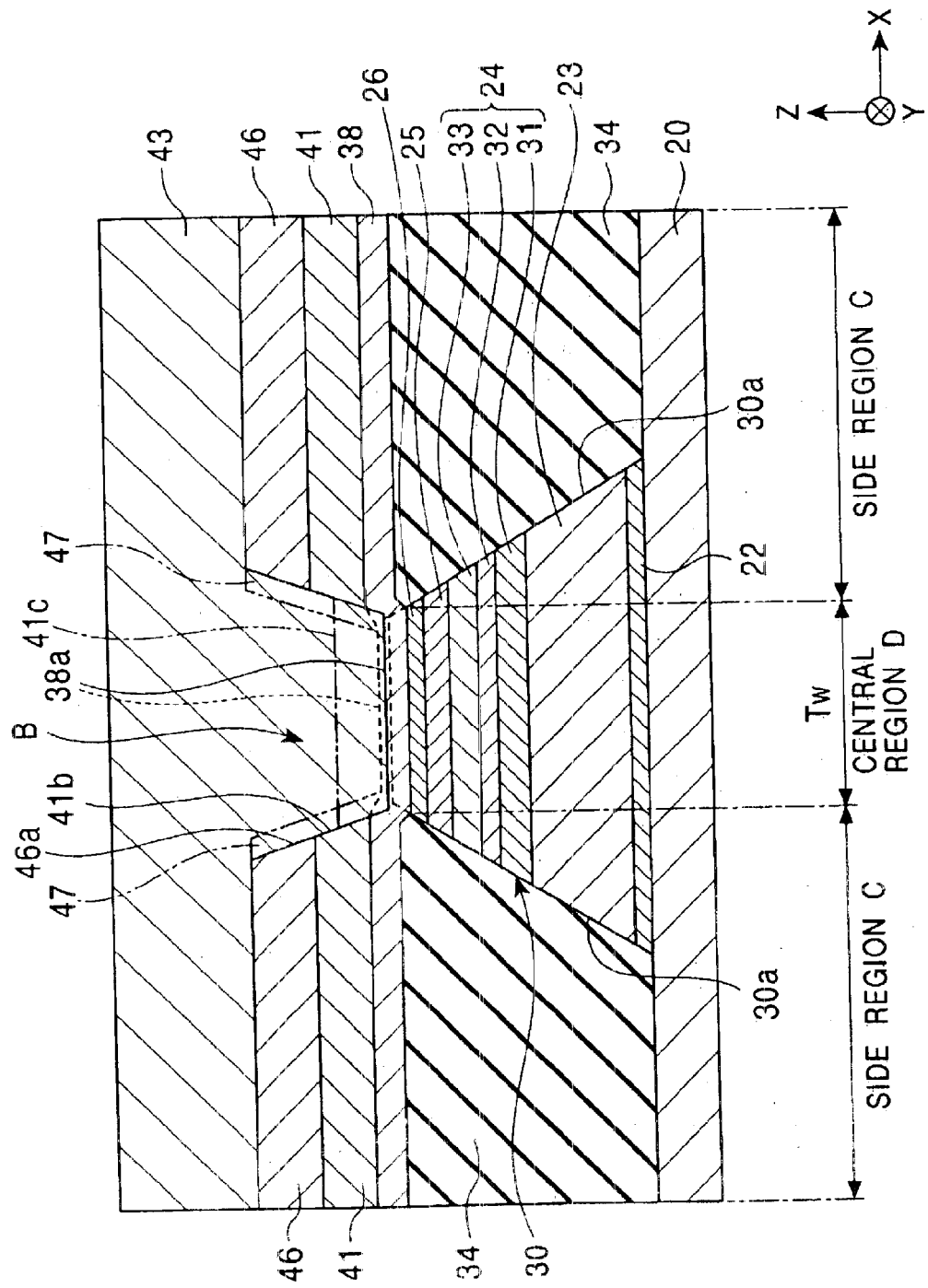
FIG. 3 is a partial sectional view which shows a structure of a magnetic sensing element in a third embodiment of the present invention, viewed from the surface facing a recording medium.

FIG. 3 is a partial sectional view which shows a magnetic sensing element in a third embodiment of the present invention, viewed from the surface facing a recording medium. The same layers as those in the sensing element shown in FIG. 1 are represented by the same reference numerals.

In the embodiment shown in FIG. 3, a second antiferromagnetic layer 41 is disposed on each side region C of a second free magnetic layer 38, and a second insulating layer 46 composed of an insulating material, such as $Al_2O_3$ or $SiO_2$, is disposed on the second antiferromagnetic layer 41.

In the embodiment shown in FIG. 3, in a space B between the second antiferromagnetic layers 41 in the track width direction (in the X direction), the surface of the central region D of the second free magnetic layer 38 is partially trimmed, and the thickness of the central region D of the second free magnetic layer 38 is smaller than the thickness of the side region C of the second free magnetic layer 38. However, in the embodiment shown in FIG. 3, the surface 38a may be not trimmed at all as indicated by the dotted line, and the thickness of the central region D of the second free magnetic layer 38 may be the same as the thickness of the side region C of the second free magnetic layer 38.

In the present invention, the second antiferromagnetic layer 41 may partially remain in the space B, and the surface 41c of the remaining second antiferromagnetic layer 41 is indicated by the dotted-chain line in FIG. 3. Preferably, the thickness of the second antiferromagnetic layer 41 remaining on the central region D of the second free magnetic layer 38 is 50 Å or less. If the thickness of the second antiferromagnetic layer 41 remaining on the central region D of the second free magnetic layer 38 is as small as that described above, an exchange coupling magnetic field is not produced between the central region D of the second antiferromagnetic layer 41 and central region D of the second free magnetic layer 38. Even if an exchange coupling magnetic field is produced, the magnitude thereof is small, and the magnetization of the central region D of the second free magnetic layer 38 is not strongly pinned.

In the embodiment shown in FIG. 3, the inner end faces 41b and 46a of the second antiferromagnetic layer 41 and the second insulating layer 46 are inclined planes or curved planes in which the width in the track width direction of the space B gradually increases upward (in the Z direction). However, the inner end faces 41b and 46a may be vertical planes parallel to the Z direction.

As indicated by the double-dotted chain line in FIG. 3, preferably, an insulating layer 47 is disposed over the inner end face 41b of the second antiferromagnetic layer 41 and the inner end face 46a of the second insulating layer 46. Consequently, the sensing current flowing into the multilayer film 30 from one of the shielding layers 20 and 43 is prevented from being shunted to the second antiferromagnetic layer 41 more effectively.

In the embodiment shown in FIG. 3, the magnetization of the side region C of the second free magnetic layer 38 is pinned in the X direction more reliably by an exchange coupling magnetic field produced between the side region C of the second antiferromagnetic layer 41 and the side region C of the second free magnetic layer 38. The central region D of the second free magnetic layer 38 is weakly aligned in a single-domain state so as to be rotated in response to an external magnetic field.

In the embodiment shown in FIG. 3, as in the embodiment shown in FIG. 1 or 2, the magnetization of the free magnetic layer can be controlled properly. The end faces 30a of the multilayer film 30 in the track width direction (in the X direction) are trimmed by etching or the like, and the length of the multilayer film 30 extending below the second antiferromagnetic layer 41 is decreased compared to the conventional case. First insulating layers 34 joining to the end faces 30a of the multilayer film 30 are disposed below the side regions C of the second antiferromagnetic layers 41.

Consequently, because of the presence of the first insulating layers 34, it is possible to prevent the sensing current, which flows from one of the shielding layers 20 and 43 into the multilayer film 30, from expanding wider than the track width Tw, and expansion of the effective read track width can be suppressed compared to the conventional case, thus preventing side reading. Therefore, it is possible to produce a CPP magnetic sensing element employing the exchange bias method in which high read output is obtained.

As described above, in the present invention, in a CPP magnetic sensing element employing the exchange bias method, the magnetization of the free magnetic layer is properly controlled, and the sensing current flowing into the multilayer film 30 can be prevented from expanding wider than the track width Tw. Therefore, a magnetic sensing element with a high read output can be fabricated.

Additionally, the magnetic sensing element shown in FIG. 3 is fabricated by a method that is different from the fabrication method for the magnetic sensing element shown in FIG. 1 or 2 as will be described below.

FIGS. 4 to 9 are sectional views which show the steps in a fabrication process of the magnetic sensing element shown in FIG. 1.

Figure 4:
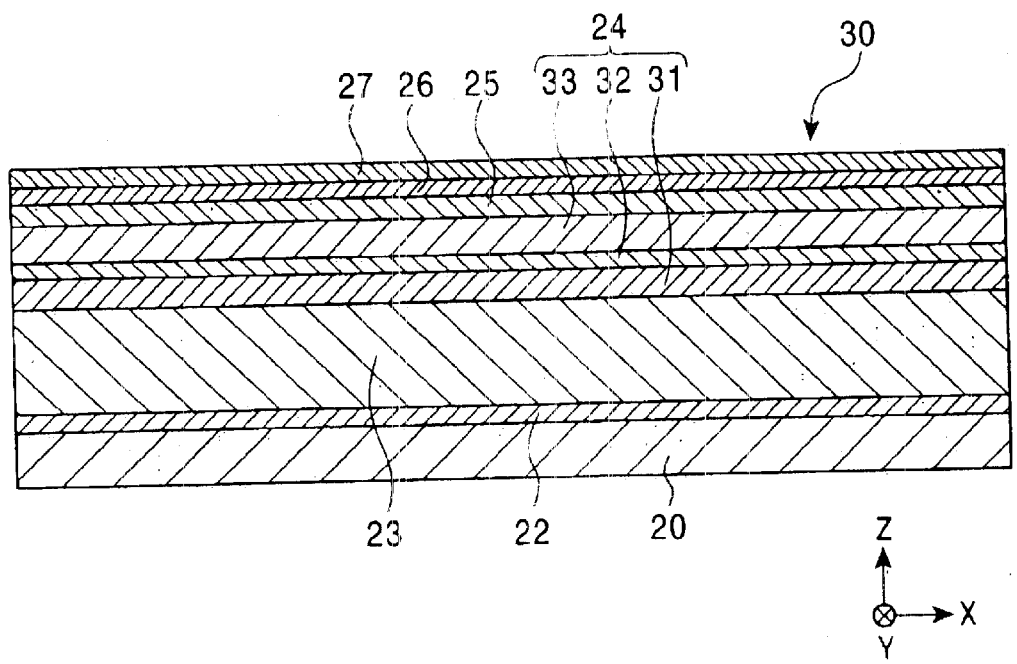
FIG. 4 is a sectional view which shows a step in a fabrication process of the magnetic sensing element shown in FIG. 1.

In the step shown in FIG. 4, a lower shielding layer 20, a seed layer 22, a first antiferromagnetic layer 23, a pinned magnetic layer 24, a nonmagnetic material layer 25, and a free magnetic layer 26, and a nonmagnetic layer 27 are continuously deposited from the bottom. A film including the layers from the seed layer 22 to the nonmagnetic layer 27 is referred to as a multilayer film 30. In the deposition step, sputtering or vapor deposition is used. In the sputtering process, DC magnetron sputtering, RF sputtering, ion beam sputtering, long-throw sputtering, collimation sputtering, or the like may be used.

The lower shielding layer 20 is composed of a magnetic material, such as a NiFe alloy. The seed layer 22 is composed of a NiFe alloy, a NiFeCr alloy, Cr, or the like. The first antiferromagnetic layer 23 is composed of an antiferromagnetic material containing X and Mn, wherein X is at least one element selected from the group consisting of Pt, Pd, Ir, Rh, Ru, and Os, or an X—Mn—X' alloy, wherein X' is at least one element selected from the group consisting of Ne, Ar, Kr, Xe, Be, B, C, N, Mg, Al, Si, P, Ti, V, Cr, Fe, Co, Ni, Cu. Zn, Ga, Ge, Zr, Nb, Mo, Ag, Cd, Ir, Sn, Hf, Ta, W, Re, Au, Pb, and rare-earth elements.

The pinned magnetic layer 24 has a synthetic ferrimagnetic structure. The pinned magnetic layer 24 has a triple-layered structure including magnetic sublayers 31 and 33 and an intermediate nonmagnetic sublayer 32. The magnetic sublayers 31 and 33 are composed of magnetic materials, for example, selected from the group consisting of CoFe alloys, CoFeNi alloys, Co, and NiFe alloys, and the intermediate nonmagnetic sublayer 32 is composed of a conductive, nonmagnetic material, such as Ru, Rh, Ir, Cr, Re, or Cu.

The nonmagnetic material layer 25 is composed of a conductive, nonmagnetic material, such as Cu, Cr, Au, or Ag. Alternatively, when a tunneling magnetoresistive element is fabricated, the nonmagnetic material layer 25 is composed of an insulating material, such as $Al_2O_3$. The first free magnetic layer 26 is composed of a magnetic material, such as a NiFe alloy or NiFeCo alloy. The nonmagnetic layer 27 is composed of a noble metal. Specifically, the nonmagnetic layer 27 is preferably composed of at least one element selected from the group consisting of Cu, Ru, Re, Pd, Os, Ir, Pt, Au, Rh, and Cr.

The nonmagnetic layer 27 composed of a noble metal, such as Cu or Ru, is a dense layer which is not easily oxidized by exposure to air. Therefore, even if the nonmagnetic layer 27 is formed thinly, the first free magnetic layer 26 is properly prevented from being oxidized by exposure to air.

In the embodiment shown in FIG. 4, the thickness of the nonmagnetic layer 27 is preferably 3 to 20 Å. Even if the thickness of the nonmagnetic layer 27 is as small as that described above, the first free magnetic layer 26 can be properly prevented from being oxidized by exposure to air.

A first annealing process in a magnetic field is performed. Annealing is performed at a first annealing temperature while applying a first magnetic field orthogonal to the track width Tw direction (X direction), i.e., in the Y direction, and an exchange coupling magnetic field is produced between the first antiferromagnetic field 23 and the magnetic sublayer 31 constituting the pinned magnetic layer 24 to pin the magnetization of the magnetic sublayer 31 in the Y direction. The other magnetic sublayer 32 is pinned in a direction opposite to the Y direction by exchange coupling due to the RKKY interaction with the magnetic sublayer 31. For example, the first annealing temperature is set at 270° C. and the magnitude of the magnetic field is set at 800 kA/m.

Figure 5:
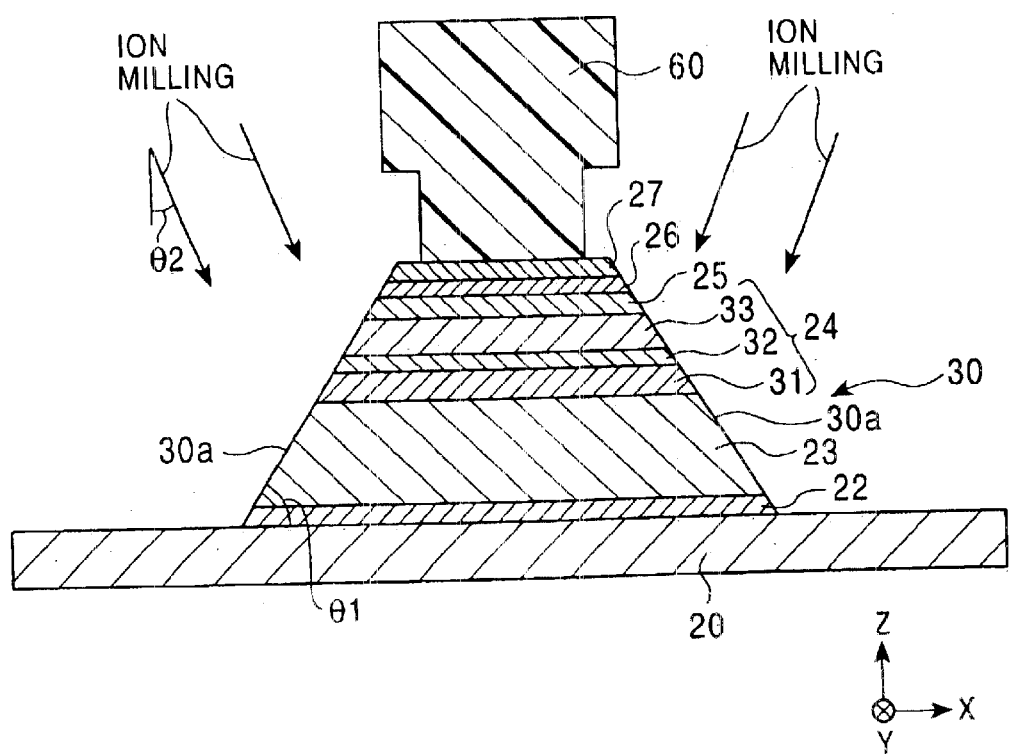
FIG. 5 is a sectional view which shows a step in the fabrication process subsequent to the step shown in FIG. 4.

In the step shown in FIG. 5, a resist layer 60 for a lift-off process is formed on the nonmagnetic layer 27 shown in FIG. 4.

Side regions in the track width direction (in the X direction) of the multilayer film 30, which includes from the seed layer 22 to the nonmagnetic layer 27, not covered with the resist layer 60 are removed by ion milling or the like.

In the step shown in FIG. 5, end faces 30a in the track width direction (in the X direction) of the multilayer film 30 left below the resist layer 60 are formed as inclined planes or curved planes so that the width in the track width direction of the multilayer film 30 gradually decreases upward (in the Z direction).

In the step shown in FIG. 5, when both sides in the track width direction of the multilayer film 30 is trimmed, the angle of ion milling must be adjusted so that the angle θ1 between the lower surface of the multilayer film 30 and the end face 30a is 60° to 90°. Preferably, the ion milling direction is perpendicular to the surface of the lower shielding layer 20 (parallel to the Z direction) as much as possible. The ion milling angle θ2 (inclination relative to the Z direction) is preferably set at 0° to 30°.

Figure 6:
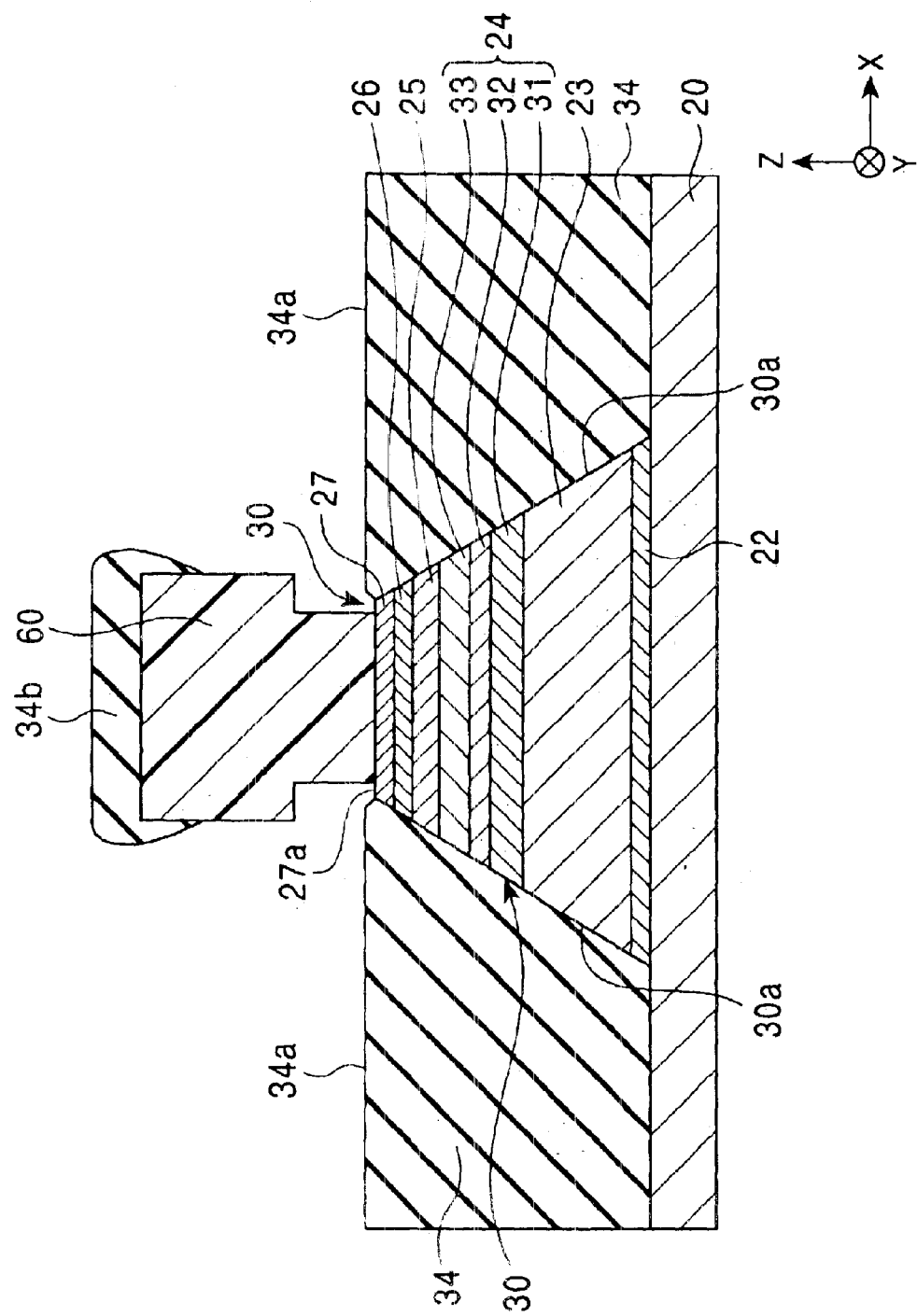
FIG. 6 is a sectional view which shows a step in the fabrication process subsequent to the step shown in FIG. 5.

In the step shown in FIG. 6, first insulating layers 34 are deposited by sputtering in the side regions in the track width direction (in the X direction) of the, multilayer film 30 shown in FIG. 5. The first insulating layer 34 is preferably composed of an insulating material, such as $Al_2O_3$ or $SiO_2$. Preferably, the first insulating layers 34 are deposited so that the end faces 30a of the multilayer film 30 are completely covered. At this stage, the upper surface 34a of the first insulating layer 34 is flush with or slightly higher than the upper surface 27a.

An insulating material layer 34b composed of the same material as that for the insulating layer 34 also adheres to the upper surface of the resist layer 60. The resist layer 60 is removed together with the insulating material layer 34b.

Figure 7:
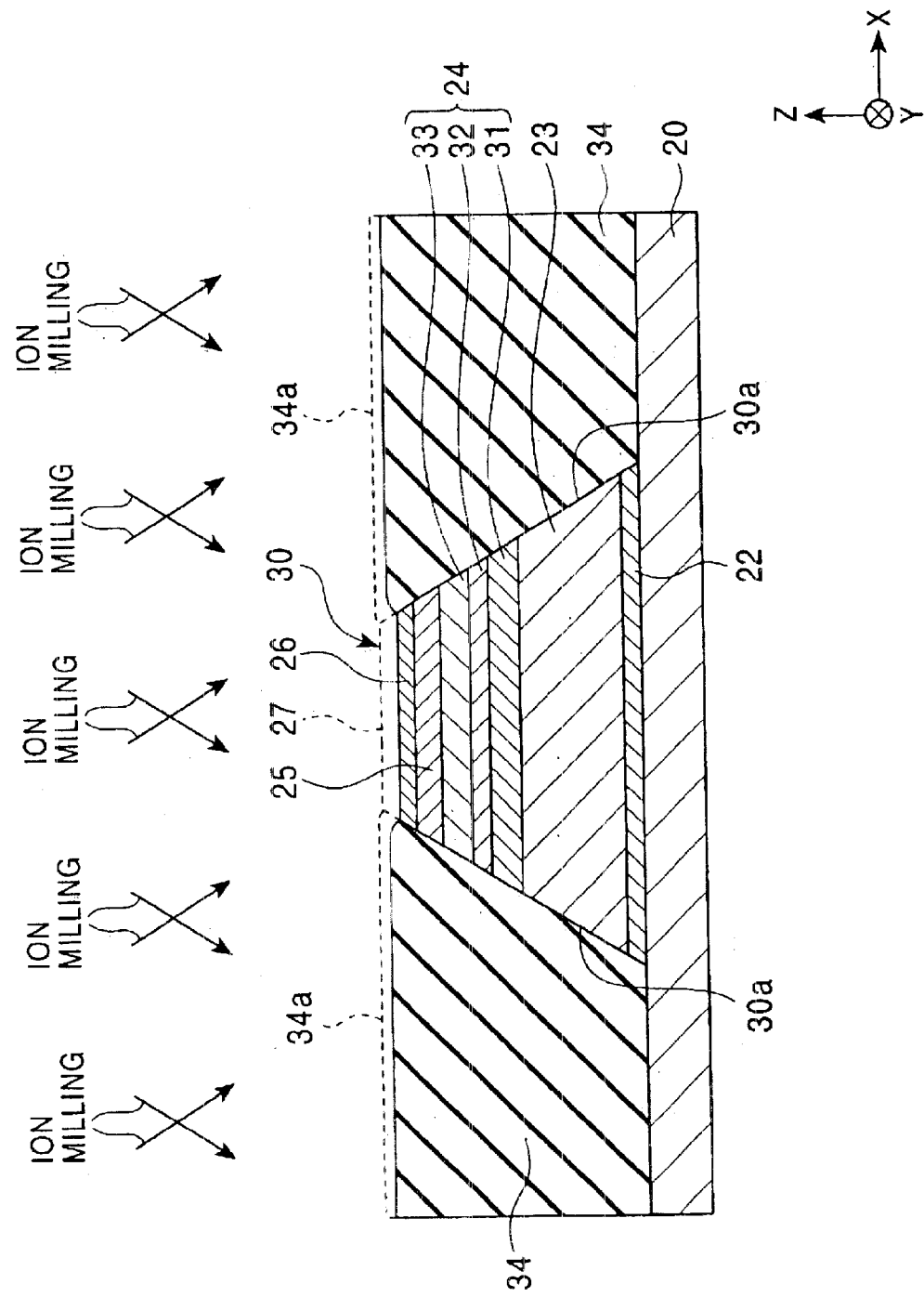
FIG. 7 is a sectional view which shows a step in the fabrication process subsequent to the step shown in FIG. 6.

In the step shown FIG. 7, the nonmagnetic layer 27 and the surfaces of the first insulating layers 34 are removed by ion milling.

In the ion milling process shown in FIG. 7, ion milling with low energy may be performed. The reason for this is that the nonmagnetic layer 27 has been deposited with an extremely small thickness of approximately 3 to 20 Å. Consequently, the nonmagnetic layer 27 can be removed by ion milling with low energy, and control of milling can be improved compared to the conventional case. Herein, ion milling with low energy is defined as ion milling using a beam of ions with a beam voltage (accelerating voltage) of less than 1,000 V. For example, a beam voltage of 150 to 500 V may be used. In this embodiment, an argon (Ar) ion beam with a low beam voltage of 200 V is used.

The reasons for performing the ion milling process in the step shown in FIG. 7 are that, since the surface of the nonmagnetic layer 27 is oxidized by exposure to air, the oxidized layer is removed, and that the thickness of the nonmagnetic layer 27 is decreased so that a proper exchange interaction is produced between the first free magnetic layer 26 and a second free magnetic layer.

Although the nonmagnetic layer 27 is completely removed in the step shown in FIG. 7, the nonmagnetic layer 27 may be partially left. Additionally, even when the nonmagnetic layer 27 is completely removed, in some cases, the element constituting the nonmagnetic layer 27 may be diffused into the first free magnetic layer 26. The diffusion of the elements may be determined by a secondary ion mass spectrometer (SIMS), energy dispersive X-ray spectoroscopy (EDX) using a transmission electron microscope (TEM), or the like.

When the nonmagnetic layer 27 is removed by ion milling, the upper surface 34a of the first insulating layer 34 located at each side in the track width direction of the nonmagnetic layer 27 is also trimmed by ion milling.

Figure 8:
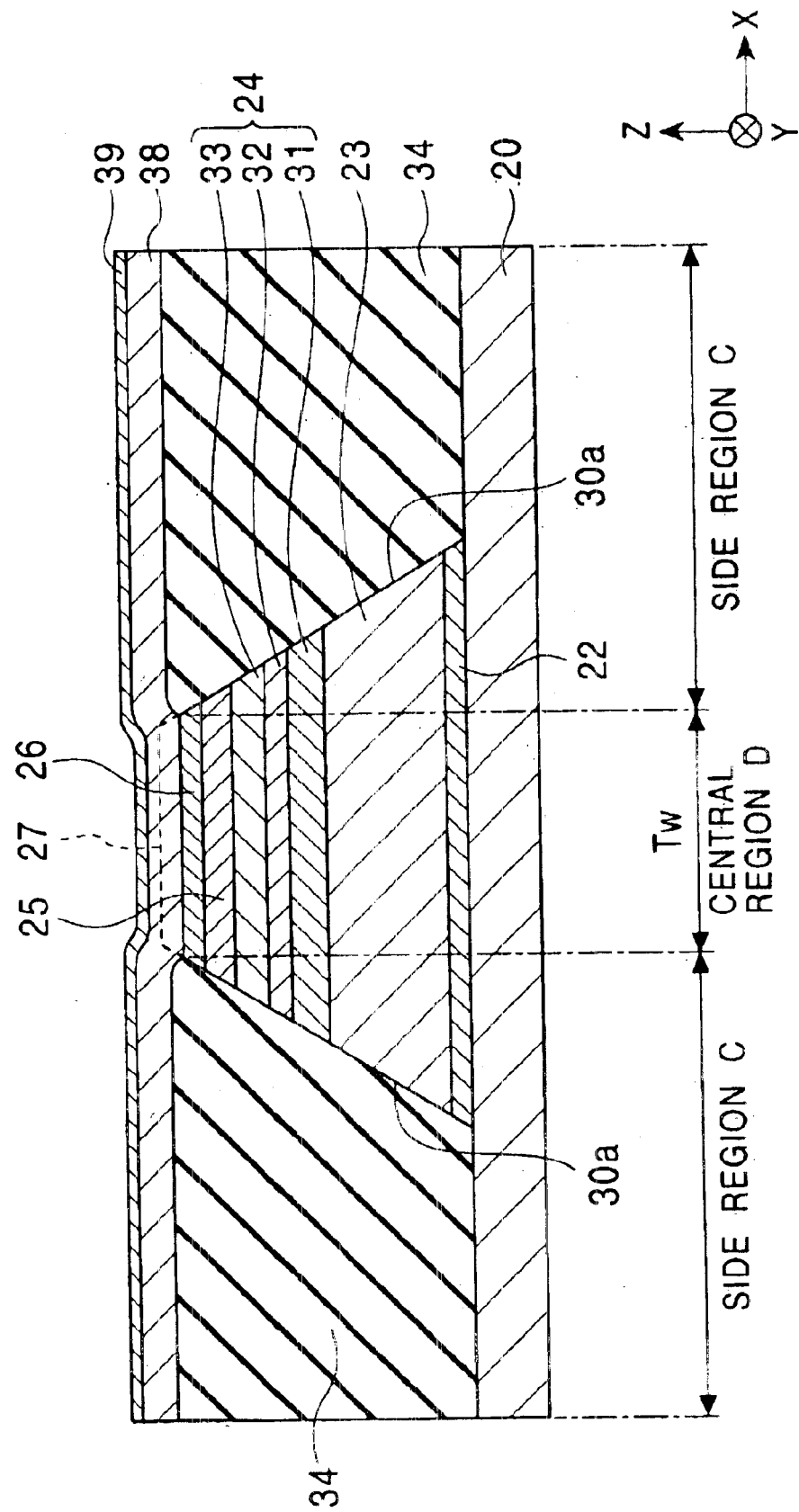
FIG. 8 is a sectional view which shows a step in the fabrication process subsequent to the step shown in FIG. 7.

In the step shown in FIG. 8, a second free magnetic layer 38 is deposited by sputtering over the first free magnetic layer 26 (the nonmagnetic layer 27 when the nonmagnetic layer 27 is partially left on the first free magnetic layer 26) and the first insulating layers 34, and a nonmagnetic layer 39 is further deposited by sputtering on the second free magnetic layer 38.

In the step shown in FIG. 8, the second free magnetic layer 38 is preferably composed of a magnetic material, such as a NiFe alloy. The second free magnetic layer 38 may have a single-layer structure or multilayer structure. Preferably, the nonmagnetic layer 39 is composed of at least one of Ru, Re, Pd, Os, Ir, Pt, Au, Rh, Cu, and Cr, as in the nonmagnetic layer 27.

The nonmagnetic layer 39 composed of a noble metal, such as Cu or Ru, is a dense layer which is not easily oxidized by exposure to air. Therefore, even if the nonmagnetic layer 39 is formed thinly, the second free magnetic layer 38 is properly prevented from being oxidized by exposure to air.

In the embodiment shown in FIG. 8, the thickness of the nonmagnetic layer 39 is preferably 3 to 20 Å. Even if the thickness of the nonmagnetic layer 39 is as small as that described above, the second free magnetic layer 38 can be properly prevented from being oxidized by exposure to air.

Figure 9:
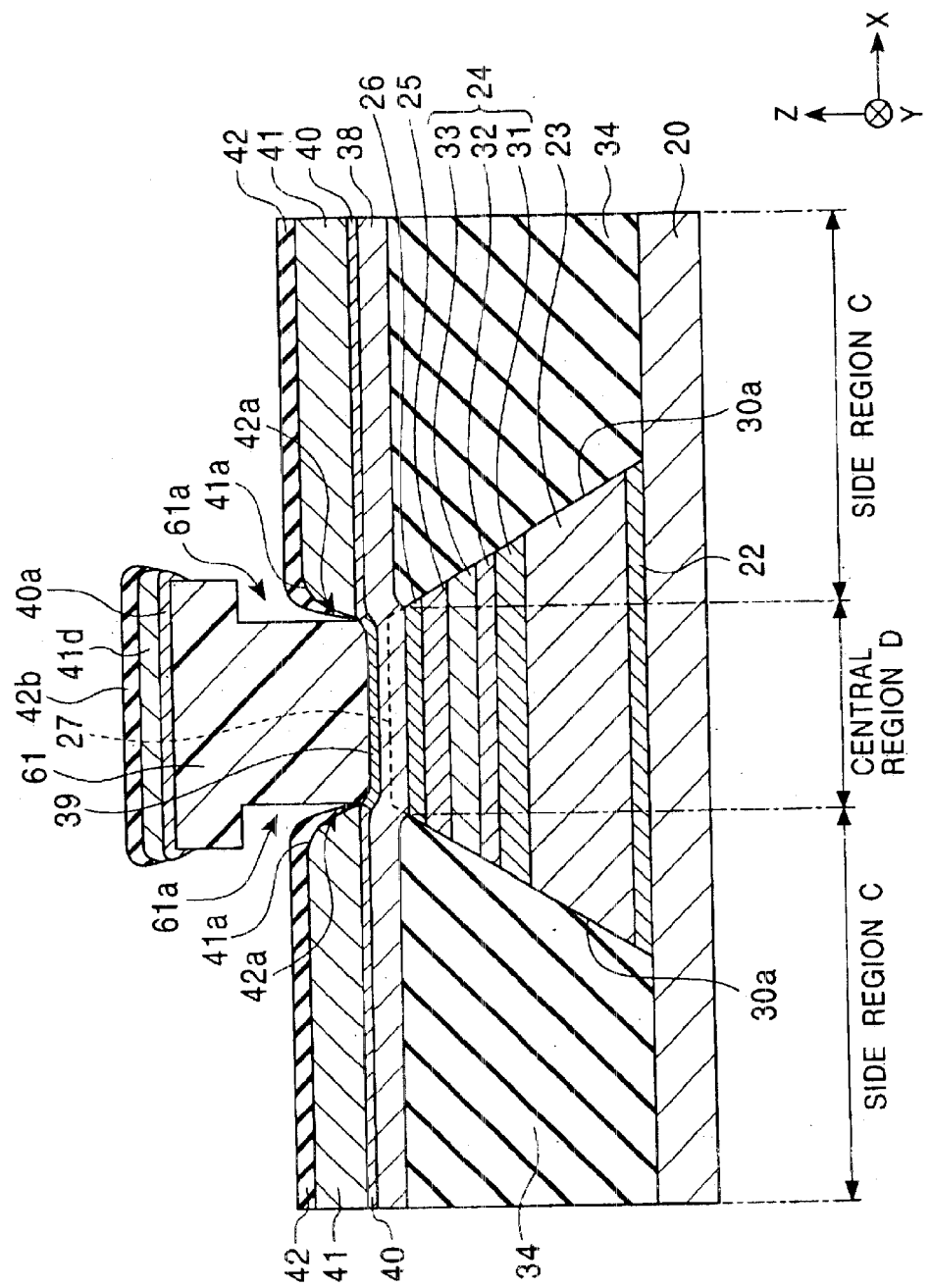
FIG. 9 is a sectional view which shows a step in the fabrication process subsequent to the step shown in FIG. 8.

In the step shown in FIG. 9, a resist layer 61 for a lift-off process is formed on the nonmagnetic layer 39. The width in the track width direction of the lower surface of the resist layer 61 is set to be the same as or slightly smaller than the width in the track width direction (in the X direction) of the upper surface of the first free magnetic layer 26. In the step shown in FIG. 9, the side regions C of the nonmagnetic layer 39 not covered with the resist layer 61 are trimmed by ion milling. The ion milling process can be performed with low energy as in the case in which the nonmagnetic layer 27 is trimmed by ion milling. Consequently, the influence of milling on the second free magnetic layer 38 below the nonmagnetic layer 39 can be minimized.

Although the side regions C of the nonmagnetic layer 39 are completely removed in the step shown in FIG. 9, the nonmagnetic layer 39 may be partially left.

A ferromagnetic layer 40 is deposited by sputtering on each side region C of the exposed second free magnetic layer 38 obtained by removing the nonmagnetic layer 39, and by changing the target without disrupting the vacuum, a second antiferromagnetic layer 41 and a second insulating layer 42 are continuously deposited on the ferromagnetic layer 40.

In the step shown in FIG. 9, the ferromagnetic layer 40 is composed of a magnetic material, such as a NiFe alloy, CoFe alloy, CoFeNi alloy, or Co. As in the first ferromagnetic layer 23, the second antiferromagnetic layer 41 is preferably composed of a PtMn alloy, X—Mn alloy, wherein X is at least one element selected from the group consisting of Pd, Ir, Rh, Ru, Os, Ni, and Fe, or Pt—Mn—X' alloy, wherein X' is at least one element selected from the group consisting of Pd, Ir, Rh, Ru, Au, Ag, Os, Cr, Ni, Ar, Ne, Xe, and Kr. The second insulating layer 42 is composed of an insulating material, such as $Al_2O_3$ or $SiO_2$.

Preferably, the sputtering angles for depositing the ferromagnetic layer 40 and the second antiferromagnetic layer 41 are set to be perpendicular to (parallel to the Z direction) or substantially perpendicular to the surface of the lower shielding layer 20, and the sputtering angle for depositing the second insulating layer 42 is slightly inclined relative to the sputtering angles for the ferromagnetic layer 40 and the second antiferromagnetic layer 41. The reason for this is that the second insulating layer 42 can also be deposited in each cut-off section 61a formed at the lower part of the resist layer 61, and thereby the inner end 42a of the second insulating layer 42 can be formed at a proper thickness on the inner end face 41a of the second antiferromagnetic layer 41. Since the inner face 41a of the second antiferromagnetic layer 41 can be properly insulated, the sensing current is properly prevented from being shunted to the second antiferromagnetic layer 41. Preferably, the inner end 42a of the second insulating layer 42 is joined to each end in the track width direction of the nonmagnetic layer 39 exposed to the central region D, which is referred to as an overlap shape. Consequently, the shunt loss of the sensing current can be suppressed more reliably. In order to form the overlap shape, the sputtering angle is controlled. Alternatively, after the resist layer 51 is removed, another resist layer (not shown in the drawing) in which the width of the lower surface is smaller than that of the resist layer 61 is formed on the nonmagnetic layer 39 in the central region D, and the second insulating layer 42 is deposited so that the inner end 42a enters the space in the track width direction between the resist layer and the second antiferromagnetic layer 41.

After the second insulating layers 42 are deposited, the resist layer 61 is removed (lifted off) using an organic solvent or the like. Additionally, to the upper surface of the resist layer 61, a ferromagnetic material layer 40a composed of the same material as that for the ferromagnetic layer 40, an antiferromagnetic material layer 41d composed of the same material as that for the second antiferromagnetic layer 41, and an insulating material layer 42b composed of the same material as that for the second insulating layer 42 are attached.

Next, a second annealing process in a magnetic field is performed. The second magnetic field is oriented in the track width direction (in the X direction). The applied second magnetic field is set smaller than the exchange anisotropic magnetic field of the first antiferromagnetic layer 23, and when the magnetizations of the second free magnetic layer 38 and the ferromagnetic layer 40 are antiparallel to each other, the second magnetic field is set smaller than the spin-flop magnetic field between the second free magnetic layer 38 and the ferromagnetic layer 40. Moreover, the annealing temperature is set lower than the blocking temperature of the first antiferromagnetic layer 23.

By performing the annealing process in the magnetic field under the conditions described above, even if the first antiferromagnetic layer 23 and the second antiferromagnetic layer 41 are composed of the same antiferromagnetic material, the magnetizations of the first free magnetic layer 26 and the second free magnetic layer 38 can be can be oriented in the X direction while maintaining the magnetization of the pinned magnetic layer 24 in the height direction.

In the embodiment shown in FIG. 9, when an exchange coupling magnetic field is produced in the X direction between the second antiferromagnetic layer 41 and the ferromagnetic layer 40 by the annealing process in the magnetic field, the magnetization of the ferromagnetic layer 40 is pinned in the X direction. Consequently, the magnetization of each side region C of the second free magnetic layer 38 facing the ferromagnetic layer in the thickness direction is pinned in the X direction due to the exchange interaction with the ferromagnetic layer 40. On the other hand, the central region D of the second free magnetic layer 38 and the first free magnetic layer 26 are weakly aligned in a single-domain state such that the magnetizations thereof are rotated in response to an external magnetic field.

In the embodiment shown in FIG. 9, the nonmagnetic layers 27 and 39 are not left between the first free magnetic layer 26 and the central region D of the second free magnetic layer 38 and between the side region C of the second free magnetic layer 38 and the ferromagnetic layer 40, respectively. When the nonmagnetic layers 27 and 39 remain, the first free magnetic layer 26 and the second free magnetic layer 38 are magnetized as follows.

That is, if the nonmagnetic layers 27 and 39 are left, for example, with thicknesses of 6 to 11 Å, exchange coupling due to the RKKY interaction between the ferromagnetic layer 40 and the second free magnetic layer 38 occurs and the magnetization directions of the ferromagnetic layer 40 and the second free magnetic layer 38 become antiparallel to each other. That is, if the magnetization of the ferromagnetic layer 40 is pinned, for example, in the X direction, the magnetization of the side region C of the second free magnetic layer 38 is pinned in a direction opposite to the X direction.

The central region D of the second free magnetic layer 38 is also magnetized in the direction opposite to the X direction, and because of the presence of the nonmagnetic layer 27, the magnetization of the first free magnetic layer 26 is aligned in the X direction which is opposite to the magnetization direction of the second free magnetic layer 38 by exchange coupling due to the RKKY interaction between the first free magnetic layer 26 and the central, region D of the second free magnetic layer 38. Consequently, the magnetizations of the first free magnetic layer 26 and the central region D of the second free magnetic layer 38 are rotated in response to an external magnetic field while maintaining the antiparallel magnetization state.

Additionally, if the thickness of the nonmagnetic layer 27 or 39 are smaller than 6 Å, the first free magnetic layer 26 and the second free magnetic layer 38, or the second free magnetic layer 38 and the ferromagnetic layer 40 are magnetized in the same direction.

After the step shown in FIG. 9 is performed, the upper shielding layer 43 shown in FIG. 1 is formed over the second, insulating layers 42 and the nonmagnetic layer 39 in the central section D exposed to a space between the second antiferromagnetic layers 41. The magnetic sensing element shown in FIG. 1 is thereby completed.

Next, a method for fabricating the magnetic sensing element shown in FIG. 2 will be described below. After the steps shown in FIGS. 4 to 7 are performed, a step shown in FIG. 10 is carried out.

Figure 10:
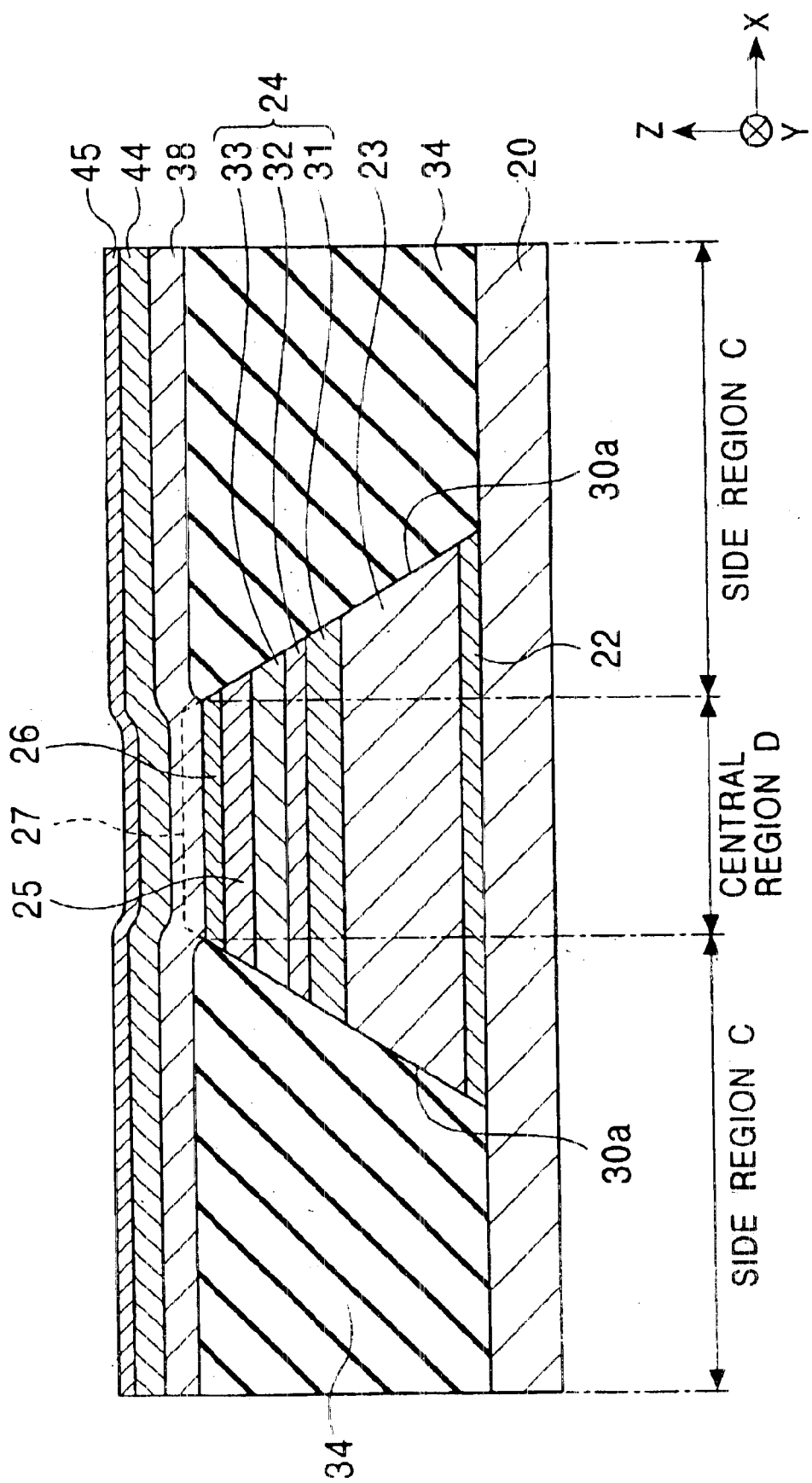
FIG. 10 is a sectional view which shows a step in a fabrication process of the magnetic sensing element shown in FIG. 2.

In the step shown in FIG. 10, a second free magnetic layer 38, a third antiferromagnetic layer 44, and a nonmagnetic layer 45 are continuously deposited by sputtering over the first insulating layers 34 and the first free magnetic layer 26 (the nonmagnetic layer 27 when the nonmagnetic layer 27 remains on the first free magnetic layer 26).

The third antiferromagnetic layer 44 may be composed of the antiferromagnetic material for the first antiferromagnetic layer 23 or for the second antiferromagnetic layer 41 which will be formed in the subsequent step. The thickness of the third antiferromagnetic layer 44 is set at 20 to 50 Å. The nonmagnetic layer 45 is preferably composed of at least one of Ru, Re, Pd, Os, Ir, Pt, Au, Rh, Cr, and Cu. Preferably, the nonmagnetic layer 45 has a small thickness of 3 to 20 Å. By forming the nonmagnetic layer 45 on the third antiferromagnetic layer 44, even if the magnetic sensing element in the fabrication process shown in FIG. 10 is exposed to air, the third antiferromagnetic layer 44 is properly prevented from being oxidized.

A first annealing process in a magnetic field may be performed in the state shown in FIG. 10. Even if the first annealing process in the magnetic field is performed, since the third antiferromagnetic layer 44 has a small thickness of 50 Å or less, antiferromagnetism is not exhibited. An exchange coupling magnetic field is not produced between the third antiferromagnetic layer 44 and the second free magnetic layer 38, or even if an exchange coupling magnetic field is produced, the magnitude thereof is small. Therefore, the magnetization of the second free magnetic layer 38 is not strongly pinned like the magnetic sublayers 31 and 33 constituting the pinned magnetic layer 24.

Figure 11:
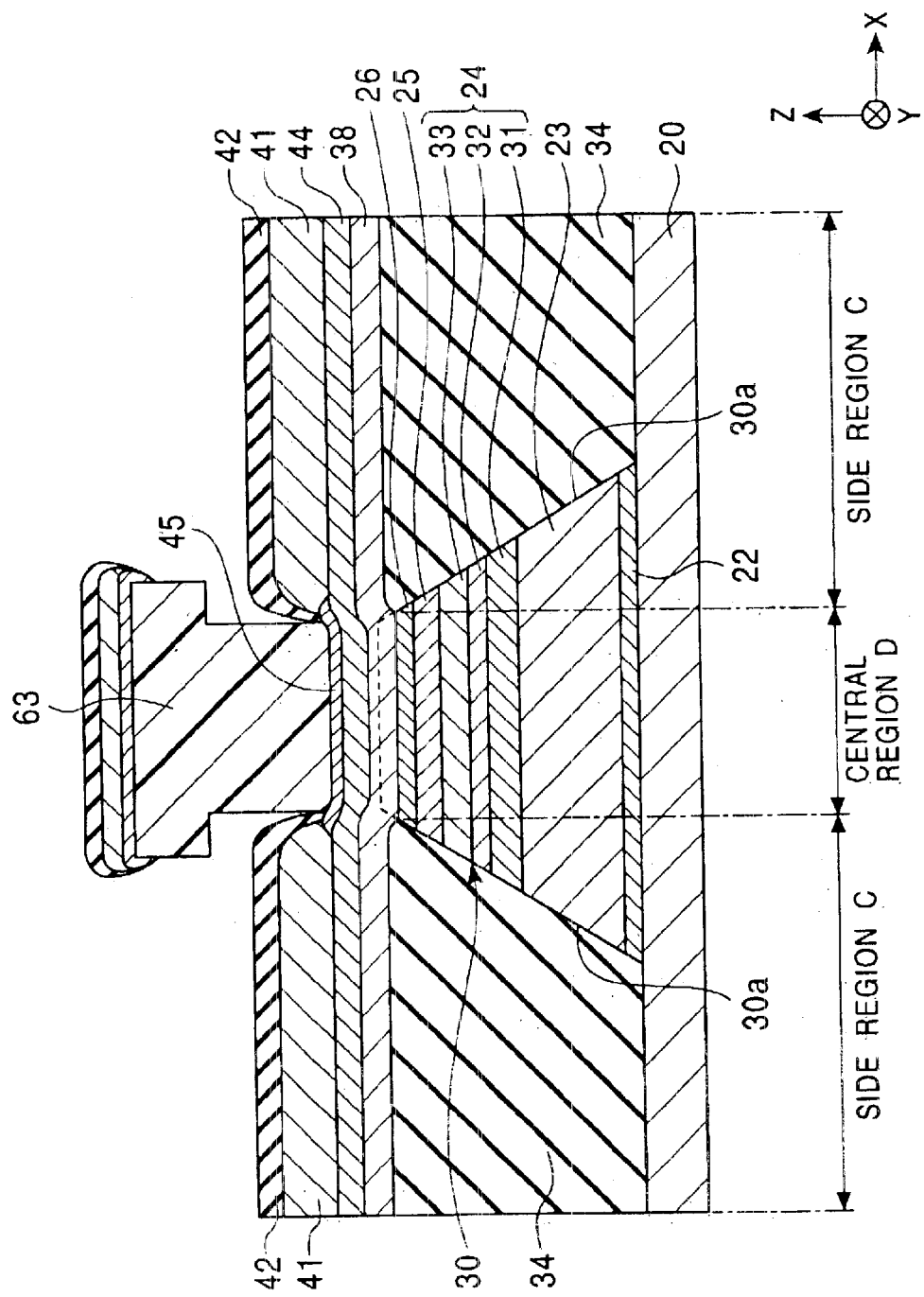
FIG. 11 is a sectional view which shows a step in the fabrication process subsequent to the step shown in FIG. 10.

In a step shown in FIG. 11, a resist layer 63 for a lift-off process is formed on the nonmagnetic layer 45. Preferably, the width in the track width direction (in the X direction) of the lower surface of the resist layer 63 is the same as or slightly smaller than the width in the track width direction of the upper surface of the first free magnetic layer 26. The nonmagnetic layer 45 in the side region C not covered with the resist layer 63 is removed by ion milling. The nonmagnetic layer 45 is composed of Ru or the like and has a thickness of 3 to 20 Å. Therefore, the nonmagnetic layer 45 can be removed by ion milling with low energy. Although the nonmagnetic layer 45 is completely removed in the step shown in FIG. 11, the nonmagnetic layer 45 may be partially left. However, the nonmagnetic layer 45 is left with an extremely small thickness of 3 Å or less.

As shown in FIG. 11, a second antiferromagnetic layer 41 and a second insulating layer 42 are continuously deposited by sputtering on the antiferromagnetic layer 44 exposed at each side in the track width direction of the resist layer 63 (on the nonmagnetic layer 45 when the nonmagnetic layer 45 is partially left). After the resist layer 63 is removed, the second annealing process in the magnetic field described above is performed.

By forming the third antiferromagnetic layer 44 with a small thickness of 50 Å or less, the central region D of the third antiferromagnetic layer 44 does not exhibit antiferromagnetism, and even when the second annealing process is performed in the magnetic field, the central region D of the third antiferromagnetic layer 44 is not easily transformed into an ordered structure. As a result, an exchange coupling magnetic field is not produced between the third antiferromagnetic layer 44 and the central region D of the second free magnetic layer 38, or even an exchange coupling magnetic field is produced, the magnitude thereof is small, and the magnetization of the second free magnetic layer 38 is not strongly pinned as in the pinned magnetic layer 24.

The reason for setting the thickness of the third antiferromagnetic layer 44 at 20 Å or more is that if the thickness is less than 20 Å, even when the second antiferromagnetic layer 41 is disposed on the side region C of the third antiferromagnetic layer 44, the side region C of the third antiferromagnetic layer 44 does not easily exhibit antiferromagnetism, and an exchange coupling magnetic field with a proper magnitude is not produced between the third antiferromagnetic layer 44 and each side region C of the second free magnetic layer 38.

The third antiferromagnetic layer 44 is provided because, even if the second antiferromagnetic layer 41 is directly formed on the side region C of the second free magnetic layer 38 without forming the third antiferromagnetic layer 44, an exchange coupling magnetic field with a proper magnitude is not produced between the second antiferromagnetic layer 41 and each side region C of the second free magnetic layer 38.

After the second annealing process in the magnetic field is performed, an upper shielding layer 43 is formed over the second insulating layers 42 and the nonmagnetic layer 45 exposed to a space between the second antiferromagnetic layers 41. The magnetic sensing element shown in FIG. 2 is thereby completed.

Next, a method for fabricating the magnetic sensing element shown in FIG. 3 will be described below. After the steps shown in FIGS. 4 to 7 are performed, a step shown in FIG. 12 is carried out.

Figure 12:
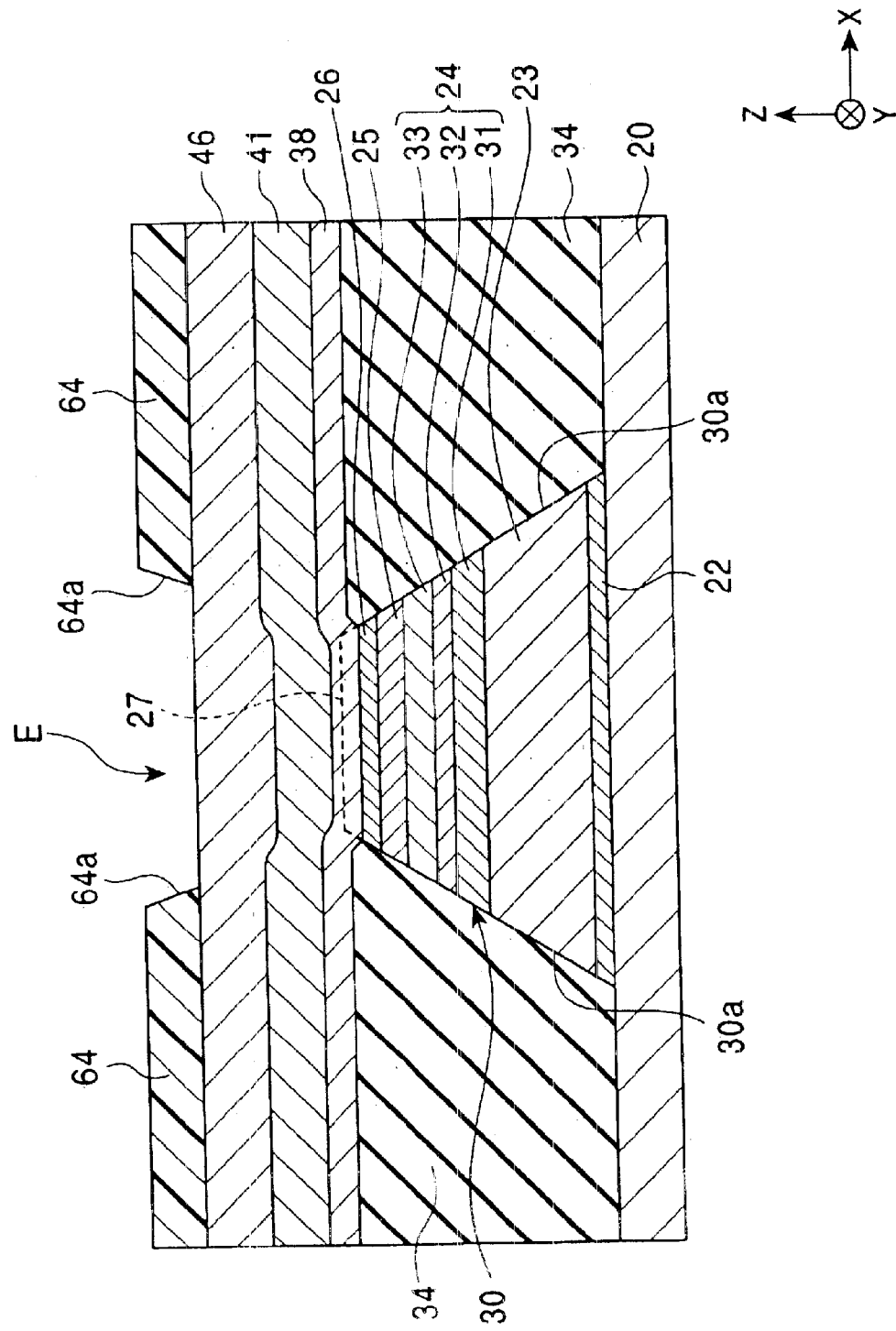
FIG. 12 is a sectional view which shows a step in a fabrication process of the magnetic sensing element shown in FIG. 3.

In the step shown in FIG. 12, a second free magnetic layer 38, a second antiferromagnetic layer 41, and a second insulating layer 46 are continuously deposited by sputtering over the first insulating layers 34 and the first free magnetic layer 26 (the nonmagnetic layer 27 when the nonmagnetic layer 27 partially remains on the first free magnetic layer 26). The materials for the individual layers have already been described above.

In the step shown in FIG. 12, a mask layer 64 is formed on the second insulating layer 46. A space E is formed in the center of the mask layer 64, and the width in the track width direction (in the X direction) of the space E is set to be the same as or slightly smaller than the width of the upper surface in the track width direction of the first free magnetic layer 26. When the inner end faces 46a and 41b are inclined planes or curved planes, the width of the space E may be slightly larger.

The mask layer 64 is composed of, for example, a resist or metal material. In the example shown in FIG. 12, the mask layer 64 is composed of a resist and the space E is formed by exposure and development. As shown in FIG. 12, the inner end faces 64a are formed as inclines planes or curved planes so that the width in the track width direction of the space E gradually increases upward. The inner end faces 64a may be vertical planes perpendicular to the upper surface of the lower shielding layer 20 (oriented in the Z direction).

Figure 13:
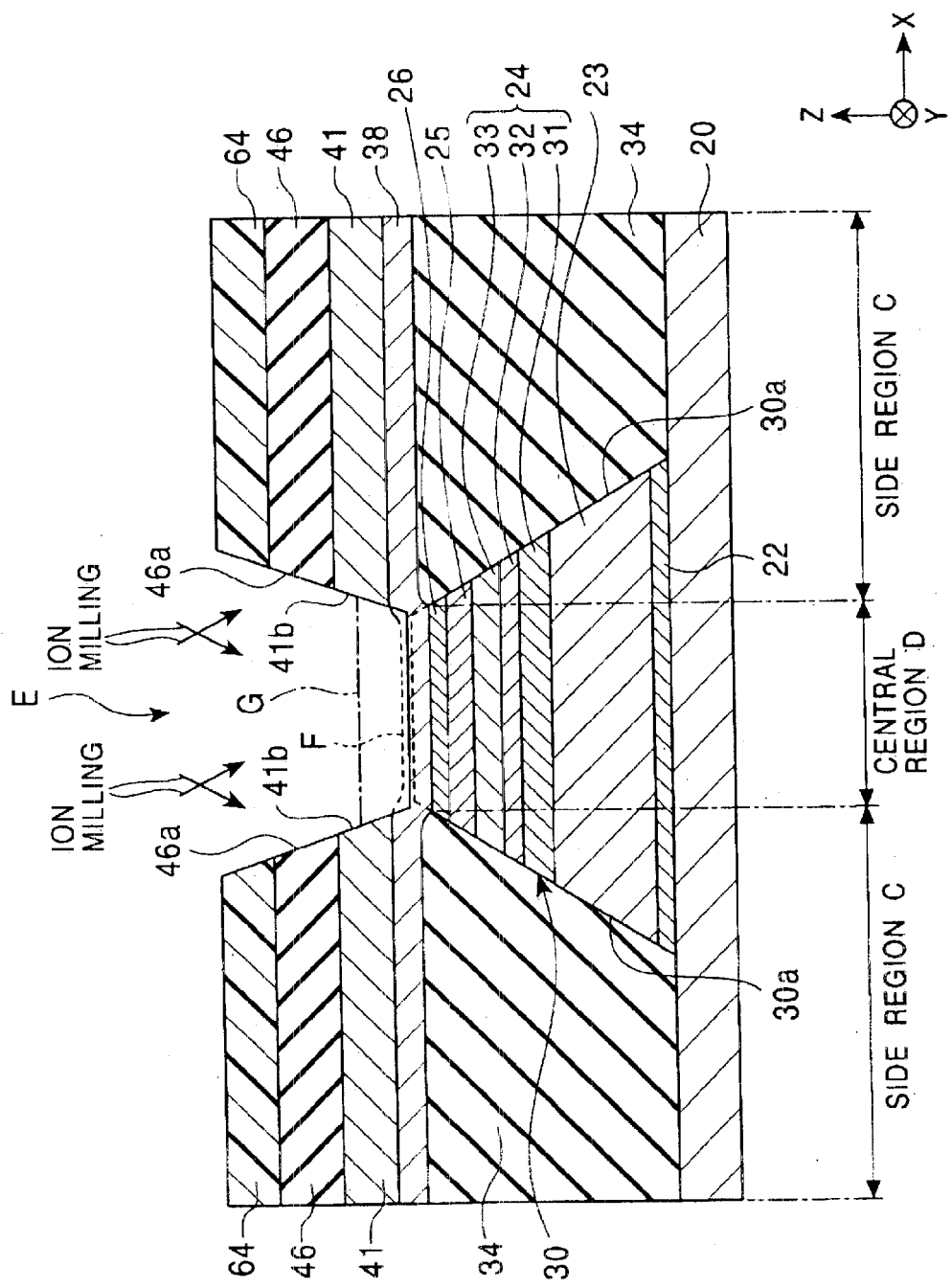
FIG. 13 is a sectional view which shows a step in the fabrication process subsequent to the step shown in FIG. 12.

In a step shown in FIG. 13, the second insulating layer 46 and the second antiferromagnetic layer 41 exposed to the space E of the mask layer 64 are dug down by ion milling or the like. Although the upper surface of the central region D of the second free magnetic layer 38 is slightly trimmed off by the ion milling process, the upper surface of the central region D of the second free magnetic layer 38 may be left with the same thickness as that of the side region C of the second free magnetic layer 38 substantially without being affected by the ion milling process.

As indicated by the dotted-chain line G in FIG. 13, the central region D of the second antiferromagnetic layer 41 may be left with a small thickness. However, the thickness of the central region D of the second antiferromagnetic layer 41 is preferably 50 Å or less. If the second antiferromagnetic layer 41 is thin to such an extent, an exchange coupling magnetic field is not produced between the central region D of the second antiferromagnetic layer 41 and the second free magnetic layer 38 even the second annealing process in the magnetic field is performed, and inconveniences, such as that the magnetization of the central region D of the second free magnetic layer 38 is strongly pinned in the X direction, do not occur.

The mask layer 64 is removed, and the second annealing process in the magnetic field is performed. The magnetic sensing element shown in FIG. 3 is thereby completed.

The magnetic sensing element shown in FIG. 3 can be fabricated more easily compared to the magnetic sensing element shown in FIG. 1 or 2. The insulating layer 47 shown in FIG. 3 may be formed by the following method.

After the step shown in FIG. 13 is performed, the insulating layer 47 is deposited by sputtering over the entire element at a sputtering angle that is inclined relative to the direction perpendicular to the substrate (not shown in the drawing). As a result, the thickness of the insulating layer 47 deposited on the inner end faces 41b and 46a of the second antiferromagnetic layer 41 and the second insulating layer 46 is set to be larger than the thickness of the insulating layer 47 deposited on the upper surface of the second free magnetic layer 38 exposed to the space E and the upper surface of the second insulating layer 46. The insulating layer 47 deposited on the upper surface of the second free magnetic layer 38 exposed to the space E is selectively removed. For that purpose, milling is performed at an angle that is closer to the vertical direction than the sputtering angle for forming the insulating layer 47. Consequently, the insulating layer 47 formed on the upper surface of the second free magnetic layer 38 exposed to the space E can be selectively removed, and the insulating layer 47 can be left at a predetermined thickness on the inner end faces 41b and 46a of the second antiferromagnetic layer 41 and the second insulating layer 46.

As described above, the method for fabricating the magnetic sensing element of the present invention is characterized in that both end faces 30a of the multilayer film 30 are trimmed by etching and the first insulating layers 34 is formed on the end faces 30a, that the second free magnetic layer 38 is formed over the insulating layers 34 and the multilayer film 30, and that the second antiferromagnetic layer 41 is formed above the second free magnetic layer 38 at the position corresponding to the first insulating layer 34 in the thickness direction. In accordance with the fabrication method of the present invention, in a CPP magnetic sensing element employing the exchange bias method, the magnetization of the free magnetic layer can be controlled easily and reliably, and by embedding the first insulating layers 34 in the side spaces in the track width direction of the multilayer film 30, it is possible to properly prevent the sensing current, which flows in the multilayer film 30, from expanding wider than the track width Tw compared to the conventional case.

The magnetic sensing element of the present invention may also be used for a magnetic head for tape recording, a magnetic sensor, etc., in addition to use for a thin-film magnetic head built in a hard disk drive.

While the present invention has been described with reference to the preferred embodiments, it is to be understood that various modifications can be made within the spirit and scope of the present invention.

It is to be understood that the embodiments described above are merely examples and do not restrict the claims of the present invention.

The present invention is characterized in that the first insulating layers are disposed at both sides in the track width direction of the multilayer film, the second free magnetic layer is disposed over the multilayer film and the first insulating layers, and the second antiferromagnetic layers are disposed on both side regions of the second free magnetic layer.

The magnetization of each side region of the second free magnetic layer is pinned in the track width direction by an exchange coupling magnetic field produced between the second antiferromagnetic layer and the side region. On the other hand, the exchange coupling magnetic field does not influence the central region of the second free magnetic layer, and the central region is weakly aligned in a single-domain state in the track width direction by a bias magnetic field due to the exchange interaction in the magnetic layer. The magnetization of the central region of the second free magnetic layer, together with the first free magnetic layer, is rotated sensitively in response to an external magnetic field. As described above, in the present invention, the magnetization of the free magnetic layer can be controlled properly by combining the first free magnetic layer, the second free magnetic layer, and the second antiferromagnetic layers.

In the present invention, the width in the track width direction of the multilayer film is decreased compared to the conventional case, and the first insulating layers are disposed under the second antiferromagnetic layers with the second free magnetic layer therebetween. Consequently, because of the presence of the first insulating layers, the sensing current less easily expands in the track width direction wider than the track width Tw. The effective read track width is effectively prevented from increasing while the magnetization of the free magnetic layer is controlled properly, thus preventing side reading and improving read output.

What is claimed is:

1. A magnetic sensing element comprising:
    a lower electrode layer;
    a multilayer film comprising a first antiferromagnetic layer, a pinned magnetic layer, a nonmagnetic material layer, and a first free magnetic layer deposited in that order on the lower electrode layer;
    a first insulating layer disposed on each end face in a track width direction of the multilayer film;
    a second free magnetic layer disposed over the first insulating layer and the first free magnetic layer;
    a second antiferromagnetic layer disposed on side regions of the second free magnetic layer, such that a portion of the second free magnetic layer is exposed in the track width direction between the second antiferromagnetic layers;
    a third antiferromagnetic layer disposed on the second free magnetic layer, wherein the second antiferromagnetic layer is disposed on both side regions of the third antiferromagnetic layer;
    a second insulating layer covering the second antiferromagnetic layers; and
    an upper electrode layer disposed over the second insulating layer and the exposed portion of the second free magnetic layer.

2. A magnetic sensing element according to claim 1, further comprising a nonmagnetic layer interposed between the first free magnetic layer and the second free magnetic layer.

3. A magnetic sensing element according to claim 2, wherein the nonmagnetic layer comprises at least one of Ru, Re, Pd, Os, Ir, Pt, Au, Rh, Cu, and Cr.

4. A magnetic sensing element according to claim 1, further comprising a ferromagnetic layer disposed between the second free magnetic layer and the second antiferromagnetic layer.

5. A magnetic sensing element according to claim 4, wherein an upper surface of the second free magnetic layer is exposed to a space between the second antiferromagnetic layers in the track width direction, and a nonmagnetic layer is disposed on the exposed upper surface.

6. A magnetic sensing element according to claim 1, wherein the upper surface of the third antiferromagnetic layer is exposed between the second antiferromagnetic layers in the track width direction, and a nonmagnetic layer is disposed on the exposed upper surface.

7. A magnetic sensing element according to claim 1, wherein the lower electrode layer functions as a lower shielding layer and the upper electrode layer functions as an upper shielding layer.

8. A magnetic sensing element according to claim 1, wherein the lower electrode layer functions as a lower shielding layer and the upper electrode layer functions as an upper shielding layer.

9. A magnetic sensing element according to claim 2, wherein the lower electrode layer functions as a lower shielding layer and the upper electrode layer functions as an upper shielding layer.

10. A magnetic sensing element according to claim 3, wherein the lower electrode layer functions as a lower shielding layer and the upper electrode layer functions as an upper shielding layer.

11. A magnetic sensing element according to claim 4, wherein the lower electrode layer functions as a lower shielding layer and the upper electrode layer functions as an upper shielding layer.

12. A magnetic sensing element according to claim 5, wherein the lower electrode layer functions as a lower shielding layer and the upper electrode layer functions as an upper shielding layer.

13. A magnetic sensing element according to claim 6, wherein the lower electrode layer functions as a lower shielding layer and the upper electrode layer functions as an upper shielding layer.

14. A magnetic sensing element comprising:

a lower electrode layer;

a multilayer film comprising a first antiferromagnetic layer, a pinned magnetic layer, a nonmagnetic material layer, and a first free magnetic layer deposited in that order on the lower electrode layer;

a first insulating layer disposed on each end face in a track width direction of the multilayer film;

a second free magnetic layer disposed over the first insulating layer and the first free magnetic layer;

a second antiferromagnetic layer disposed on side regions of the second free magnetic layer, such that a portion of the second free magnetic layer is exposed in the track width direction between the second antiferromagnetic layers; a third antiferromagnetic layer disposed on the second free magnetic layer, wherein the second antiferromagnetic layer is disposed on both side regions of the third antiferromagnetic layer;

a ferromagnetic layer disposed between the second free magnetic layer and the second antiferromagnetic layer;

a second insulating layer covering the second antiferromagnetic layer; and an upper electrode layer disposed over the second insulating layer and the ferromagnetic layer, wherein the nonmagnetic layer comprises at least one of Ru, Re, Pd, Os, Ir, Pt, Au, Rh.

15. A magnetic sensing element comprising:

a lower electrode layer;

a multilayer film comprising a first antiferromagnetic layer, a pinned magnetic layer, a nonmagnetic material layer, and a first free magnetic layer deposited in that order on the lower electrode layer;

a first insulating layer disposed on each end face in a track width direction of the multilayer film;

a second free magnetic layer disposed over the first insulating layer and the first free magnetic layer;

a second antiferromagnetic layer disposed on side regions of the second free magnetic layer, such that a portion of the second free magnetic layer is exposed in the track width direction between the second antiferromagnetic layers, and a nonmagnetic layer is disposed on the exposed portion; a third antiferromagnetic layer disposed on the second free magnetic layer, wherein the second antiferromagnetic layer is disposed on both side regions of the third antiferromagnetic layer; and a second insulating layer covering the two second antiferromagnetic layers; and an upper electrode layer disposed over the second insulating layer and the nonmagnetic layer.

* * * * *